US008249736B2

(12) United States Patent  
Kelley

(10) Patent No.: US 8,249,736 B2  
(45) Date of Patent: Aug. 21, 2012

(54) REGISTRATION SYSTEM AND METHOD

(75) Inventor: Andrew Gavin Kelley, Shotley Bridge (GB)

(73) Assignee: XACT-PCB Ltd., Tyne + Wear (GB)

( * ) Notice: Subject to any disclaimer, the term of this patent is extended or adjusted under 35 U.S.C. 154(b) by 527 days.

(21) Appl. No.: 12/306,710

(22) PCT Filed: Jun. 27, 2007

(86) PCT No.: PCT/GB2007/002391  
§ 371 (c)(1),  
(2), (4) Date: Aug. 6, 2009

(87) PCT Pub. No.: WO2008/001077  
PCT Pub. Date: Jan. 3, 2008

(65) Prior Publication Data  
US 2011/0130860 A1 Jun. 2, 2011

(30) Foreign Application Priority Data

Jun. 28, 2006 (GB) .................................. 0612805.2

(51) Int. Cl.  
*H01L 21/44* (2006.01)  
*G06F 17/50* (2006.01)  
*G06F 19/00* (2011.01)  
*G06F 7/60* (2006.01)

(52) U.S. Cl. ............ 700/121; 438/614; 716/51; 716/52; 716/54; 716/100; 703/2

(58) Field of Classification Search .................. 438/614; 703/2; 716/51–54, 110; 700/121  
See application file for complete search history.

(56) References Cited

U.S. PATENT DOCUMENTS

| 5,387,885 | A | * | 2/1995 | Chi ............................... 333/100 |
| 6,154,716 | A | * | 11/2000 | Lee ................................... 703/2 |
| 6,165,658 | A | | 12/2000 | Taff et al. |
| 6,265,242 | B1 | * | 7/2001 | Komori et al. ................... 438/66 |
| 6,581,202 | B1 | * | 6/2003 | Tourne et al. .................... 716/51 |
| 6,658,375 | B1 | * | 12/2003 | McQuarrie et al. ............... 703/2 |
| 6,701,511 | B1 | | 3/2004 | Filseth et al. |
| 6,760,471 | B1 | * | 7/2004 | Raymond ...................... 382/147 |
| 6,768,141 | B2 | * | 7/2004 | Bahl et al. ...................... 257/197 |
| 2002/0030288 | A1 | * | 3/2002 | Hashimoto ................... 257/784 |

(Continued)

OTHER PUBLICATIONS

Eliasi et al.,"Monte Carlo Thermal Optimization of Populated Printed Circuit Board", 1990, IEEE, p. 953-60.*

(Continued)

*Primary Examiner* — John R. Cottingham  
*Assistant Examiner* — Thomas Stevens  
(74) *Attorney, Agent, or Firm* — Lowenstein Sandler PC

(57) ABSTRACT

Printed circuit boards are manufactured by forming a composite layer using a control system which models a production process to generate data using non-linear compensation techniques to compensate for non-linear distortion occurring in a circuit layout applied to a constituent layer. Measurement data of actual circuit layouts is used to update stored values of parameters used in the modelling process. In one form of the model, the desired layout in the composite layer is represented by an array of cells and cell sizes corresponding to an initial stage of the production process are calculated, the model working backwards from the final state of the production process to the initial state, and a finite element model used to determine corresponding positions of cells, taking account of interaction between cells, from which the compensation data is calculated.

38 Claims, 24 Drawing Sheets

U.S. PATENT DOCUMENTS

2003/0130826 A1    7/2003   Nguyen
2004/0036082 A1*   2/2004   Bahl et al. ............ 257/197
2007/0079190 A1*   4/2007   Hillman et al. ............ 714/724

OTHER PUBLICATIONS

S. Banerji et al., "Warpage-Induced Lithographic Limitations of FR-4 and the Need for Novel Board Materials for Future Microvia and Global Interconnect Needs," IEEE Transactions on Advanced Packaging, IEEE Service Center, Feb. 2005, p. 102-113, vol. 28, No. 1, US.

J. R. Bupp et al., "High-Density Board Fabrication Techniques," IBM Journal of Research and Development, May 1982, p. 306-317, vol. 26, No. 3, US.

* cited by examiner

DATA MODELLING MODULE

Fig. 5

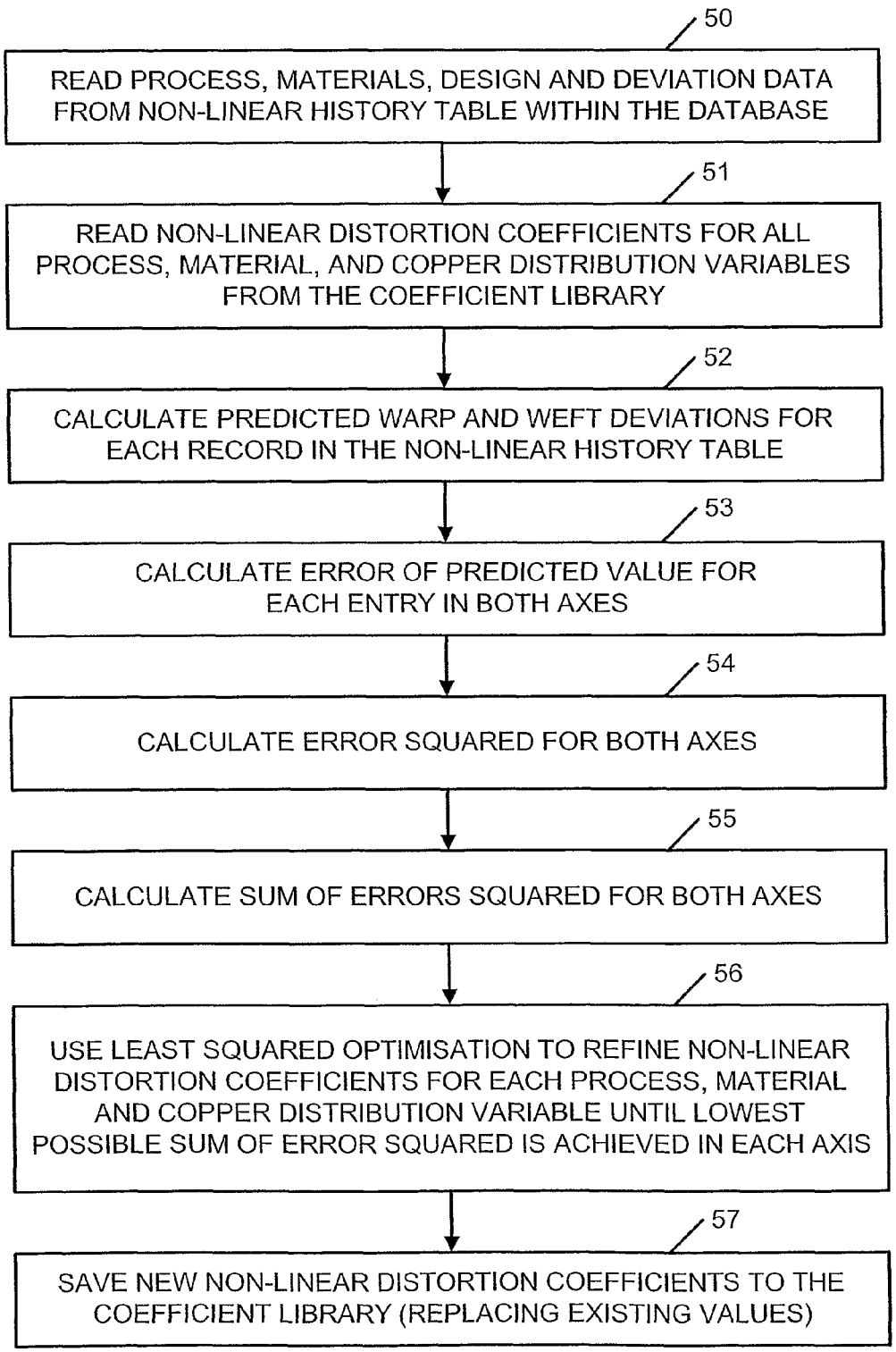

50 — READ PROCESS, MATERIALS, DESIGN AND DEVIATION DATA FROM NON-LINEAR HISTORY TABLE WITHIN THE DATABASE

51 — READ NON-LINEAR DISTORTION COEFFICIENTS FOR ALL PROCESS, MATERIAL, AND COPPER DISTRIBUTION VARIABLES FROM THE COEFFICIENT LIBRARY

52 — CALCULATE PREDICTED WARP AND WEFT DEVIATIONS FOR EACH RECORD IN THE NON-LINEAR HISTORY TABLE

53 — CALCULATE ERROR OF PREDICTED VALUE FOR EACH ENTRY IN BOTH AXES

54 — CALCULATE ERROR SQUARED FOR BOTH AXES

55 — CALCULATE SUM OF ERRORS SQUARED FOR BOTH AXES

56 — USE LEAST SQUARED OPTIMISATION TO REFINE NON-LINEAR DISTORTION COEFFICIENTS FOR EACH PROCESS, MATERIAL AND COPPER DISTRIBUTION VARIABLE UNTIL LOWEST POSSIBLE SUM OF ERROR SQUARED IS ACHIEVED IN EACH AXIS

57 — SAVE NEW NON-LINEAR DISTORTION COEFFICIENTS TO THE COEFFICIENT LIBRARY (REPLACING EXISTING VALUES)

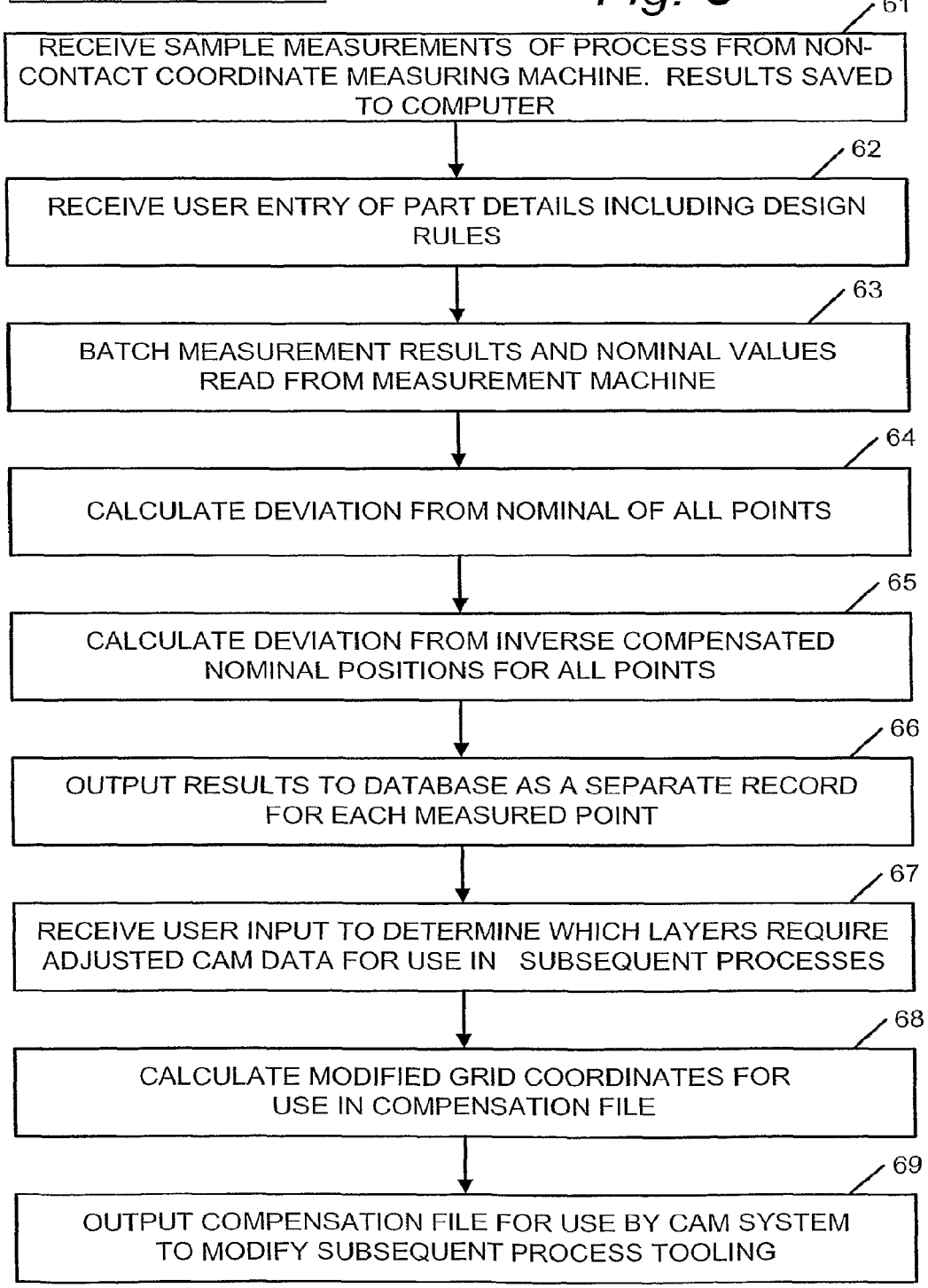

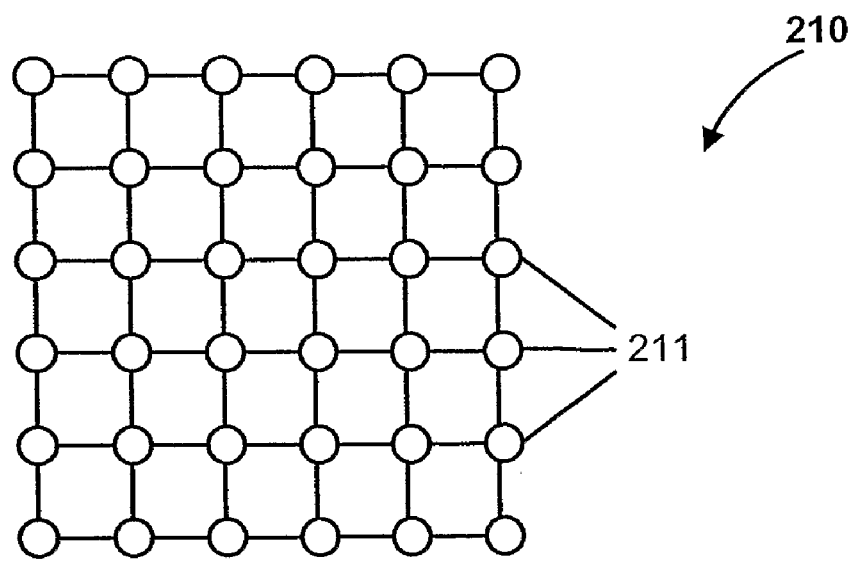
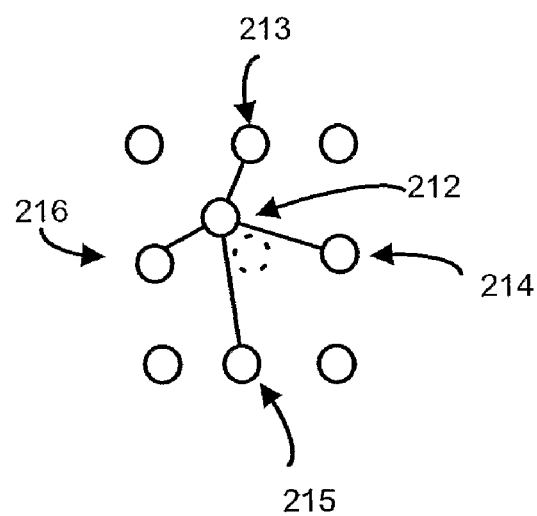
*Fig. 21*

REGISTRATION SYSTEM AND METHOD

FIELD OF THE INVENTION

The present invention relates to the registration of layers forming printed circuit boards.

BACKGROUND OF THE INVENTION

The manufacture of printed circuit boards (PCBs) involves a succession of processing steps, some of which convert a circuit design of multiple layers to images, patterns, or circuits that will be transposed to a base material for subsequent processing into electrical inter-connections. The design may be directly imposed on a production medium or on a drawing or graphical representation medium. Most usually the design is converted to a digital data representation. Conversion to a digital data representation may be accomplished with commercially available Computer Aided Design (CAD) software. The CAD program, in concert with a computer aided manufacture (CAM) program, translates the design data to a "layout" of a series of items such as tracks, pads, interconnection holes, embedded components and solder masks to be placed on the base material which is in the form of a panel. The said items are referred to hereinafter as "features". The layout is usually transposed to a medium called artwork although the layout may also be directly transposed via a digital imaging technique, for example a laser or inkjet. Ultimately, layers of the panel will be combined to make a PCB. Most PCB's are multi-layered.

In the fabrication of PCB's multiple layers of different materials are built up. Features are located in each of the layers and connections are made between them using a drilled hole that is made conductive. During fabrication dimensional changes occur in the base material resulting in a difference between the initial location of a feature and its actual location post manufacture. The spacing of features is particularly important so as to not to short out or interfere with adjacent features. Where interconnections are to be made between features located in different layers of the board it is vitally important that the features of each layer are correctly aligned. The process of aligning features located in different layers is referred to as registration. One of the problems associated with achieving accurate registration is that the manufacturing processes to fabricate a printed circuit board involve repeated heating and cooling of the board. This repeated heating and cooling, in particular when the inner layers are laminated together under temperature and pressure, causes distortion of the different layers of the board and the position of features located thereon. The removal of copper during the processing causes material movement as stresses built into the materials during manufacture are allowed to relax. As different layers of the board will have different copper designs and may be manufactured from different materials the extent to which layers distort may differ.

As the density of components and/or features on boards increases the importance of accurate registration increases. Currently industry standard minimum track widths are 100 micron. However, industry forecasts indicate that track widths will reduce to 5 microns in the future. Such a decrease in track width would result in a massive increase in track density. If this density were increased without providing for more accurate registration the amount of waste, i.e. boards that do not function correctly due to features not being connected properly, will increase substantially Some attempts have been made to increase the accuracy of registration. For example, U.S. Pat. No. 6,581,202 describes a system and method of linear compensation in which targets are inserted throughout the layout of a PCB. Post manufacture measurement of the targets are compared to pre-manufacture position so as to calculate a non-linear regression analysis best fit model which is used to predict a feature's location upon or within a PCB given the feature's position. The non-linear regression analysis results in a set of x and y polynomial equations. These polynomial equations allow for a linear compensation to be applied to the feature position on a layout so as to minimize misregistration of features in the manufacture of PCBs.

U.S. Pat. No. 6,701,511 describes a method of adjusting preliminary feature position characteristics of a preliminary mask pattern to produce a desired etch pattern on a substrate. Adjustment distances are calculated based on numbers in a table computed on the basis of measurements made of a test pattern etched on a substrate which was previously manufactured by exposing a test mask.

U.S. Pat. No. 6,165,658 describes non-linear image distortion correction in printed circuit board manufacturing in which the complete conductor pattern of a layer is scanned by an image scanner after manufacture and compared with an initial map to create an error vector map. This vector map is used to correct the initial map to be used in further production.

U.S. Pat. No. 6,658,375 describes a compensation model based on experiments on experimental PCB boards, thereby generating coefficients for a polynomial equation used in calculating a linear compensation error to be applied to a CAD file.

SUMMARY OF THE INVENTION

According to one aspect of the present invention there is disclosed a method of operating a control system for controlling the manufacture of printed circuit boards, the steps performed by the control system comprising:

modelling a production process in which a composite layer is formed from constituent layers, the modelling generating non-linear compensation data to compensate for non-linear distortion occurring in a circuit layout applied to one of the constituent layers and the modelling using stored values of parameters representing properties of respective materials of the constituent layers;

outputting the compensation data for modifying a desired layout to generate a compensated layout to be applied in the production process;

receiving measurement data representative of the actual circuit layout output from at least one phase of the production process utilizing the compensated layout;

processing the measurement data to obtain optimized values of the parameters used in modelling; and updating the stored values of parameters with optimized values of the parameters used in modelling to be used in future modelling of the production process.

A further aspect of the present invention relates to a control system for controlling the manufacture of printed circuit boards, the control system comprising:

a modelling module adapted to model a production process in which a composite layer is formed from constituent layers, the modelling module generating non-linear compensation data to compensate for non-linear distortion occurring in a circuit layout applied to at least one of the constituent layers and the model using stored values of parameters representing properties of respective materials of the constituent layers;

the modelling module being adapted to output the compensation data for modifying a desired layout to generate a compensated layout to be applied in the production process;

the control system further comprising an interface adapted to receive measurement data representative of the actual circuit layout output from at least one phase of the production process utilizing the compensated layout;

a model data optimizing module adapted to process the measurement data to obtain optimized values of the parameters used in modelling and update the stored values of parameters with optimized values of the parameters used in modelling to be used in future modelling of the production process.

A further aspect of the present invention relates to a method of operating a control system for controlling the manufacture of printed circuit boards, the steps performed by the control system comprising:

modelling a production process in which a composite layer is formed from constituent layers, the modelling generating compensation data to compensate for distortion occurring in a circuit layout applied to at least one of the constituent layers; and outputting the compensation data for modifying a desired layout to generate a compensated layout to be applied in the production process;

wherein the modelling step comprises:

representing the desired layout of an end result of the production process as an array of cells of nominal size;

determining modified cell sizes corresponding to an initial stage of the production process, ignoring interaction between cells, taking account of changes in properties of materials associated with each cell during the production process;

representing cell positions at the end of the production process as a regular array of the cells having nominal size;

applying a finite element model to take account of interaction between cells and thereby to determine modified positions of each cell at the initial stage of the production process; and generating the compensation data from the modified cell positions.

A further aspect of the present invention relates to a control system for controlling the manufacture of printed circuit boards, the control system comprising:

a modelling module adapted to model a production process in which a composite layer is formed from constituent layers, the modelling module generating compensation data to compensate for distortion occurring in a circuit layout applied to at least one of the constituent layers; and the modelling module being adapted to output the compensation data for modifying a desired layout to generate a compensated layout to be applied in the production process;

wherein the modelling module is adapted to:

represent the desired layout of an end result of the production process as an array of cells of nominal size;

to determine modified cell sizes corresponding to an initial stage of the production process, ignoring interaction between cells, taking account of changes in properties of materials associated with each cell during the production process;

to represent cell positions at the end of the production process as a regular array of the cells having nominal size;

to apply a finite element model to take account of interaction between cells and thereby to determine modified positions of each cell at the initial stage of the production process; and to generate the compensation data from the modified cell positions.

The present invention also relates to a method of manufacture of printed circuit boards using the above method of operating a control system.

Further aspects of the present invention relate to a computer program for carrying out the method and to a storage medium for storing the program.

The present invention provides for the application of non-linear compensation to a substrate which may form part of a pcb for example. The application of non-linear compensation results in much more accurate registration than does linear compensation.

BRIEF DESCRIPTION OF THE DRAWINGS

In the drawings, which illustrate a preferred embodiment of a registration system and method according to embodiments of the invention:

FIG. 5 is a block diagram illustrating the process of the Data Modelling Module shown in FIG.

FIG. 6 is a block diagram illustrating the process of the Operator Engineer Module shown in FIG. 3;

FIG. 21 illustrates a finite element model representing cells as a grid of connected nodes;

DETAILED DESCRIPTION OF THE PREFERRED EMBODIMENTS

Figure 1:
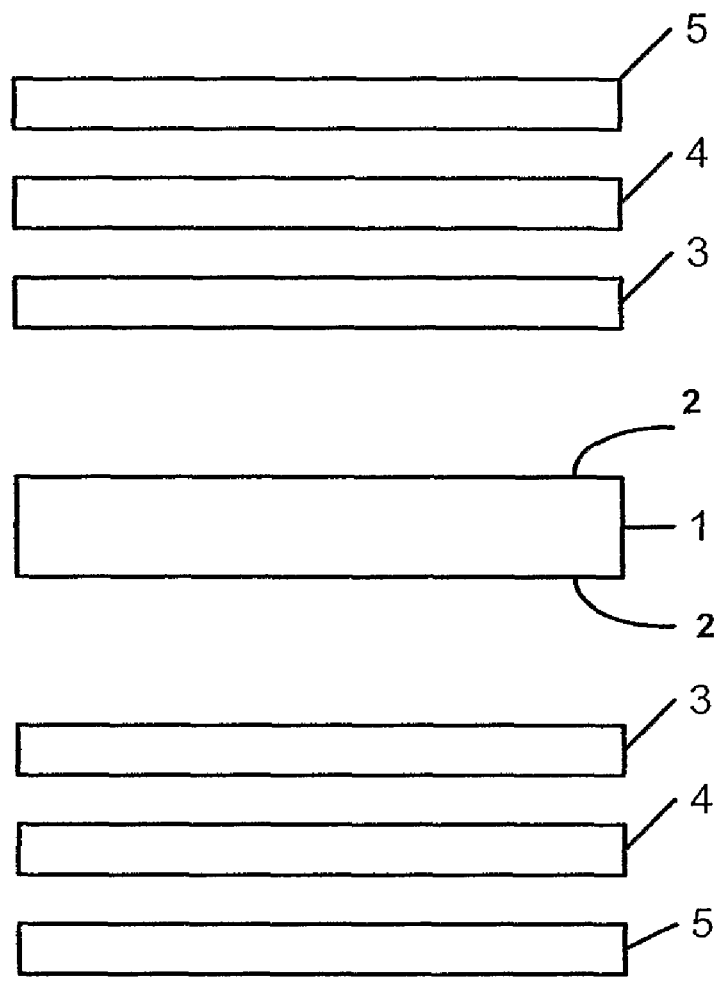
FIG. 1 is an exploded view a printed circuit board

FIG. 1 illustrates schematically (not to scale) in exploded view a four layer printed circuit board construction comprising a core 1 constructed from glass cloth and cured epoxy resin and clad on opposing surfaces with copper foil 2, a first layer 3 of woven glass fibre cloth impregnated with epoxy resin (known as pre-preg), a second layer 4 of woven glass fibre cloth impregnated with epoxy resin and an outer layer of copper foil 5. The first and second layers 3, 4 may be of different types and/or thickness of woven glass fibre cloth with different numbers of threads per unit of length. Different epoxy resins, each having their own properties may be used in association with each layer 3, 4. Woven glass fibre cloths and different epoxy resins exert different physical influences on the copper creating different movements thereof. A first embodiment of the present invention seeks to predict where feature elements located in the various layers will be post manufacture and to adjust the positioning of features pre-manufacture to ensure that the said features are located substantially in the desired position.

Figure 2:
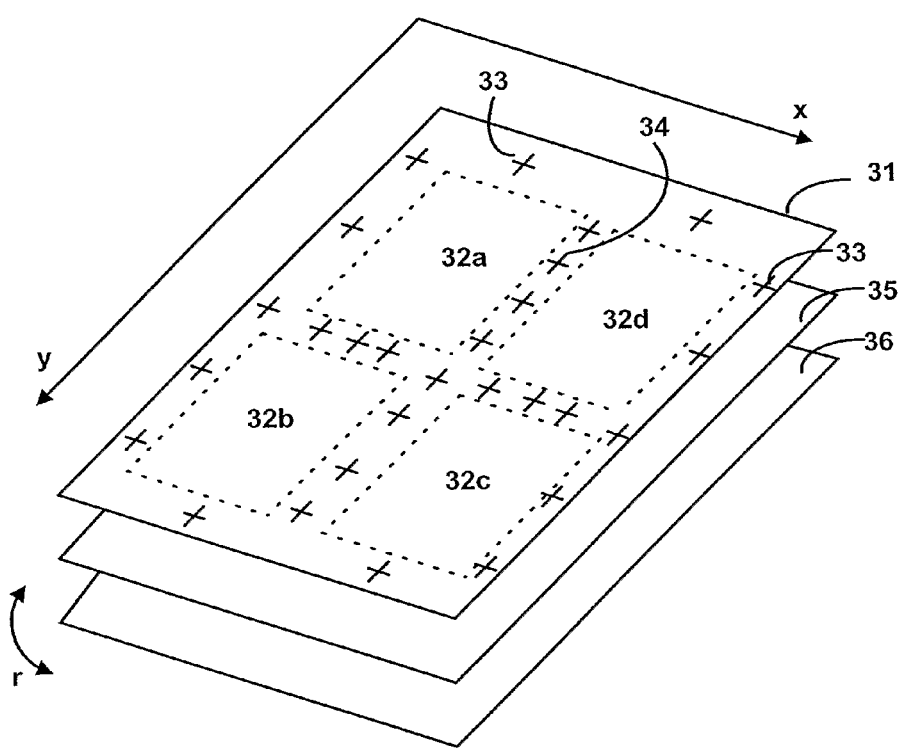
FIG. 2 is an exploded view of a printed circuit board providing a number of circuits post manufacture.

FIG. 2 illustrates part of a printed circuit board, three layers 31, 35 and 36 being shown. The layer 31 mounts four circuits 32a to 32d. Sixteen targets 33 are located around the outside of the layer 31, and a further fourteen targets 34 are located between the circuits 32a to 32d. The system and method of the embodiments are concerned with correcting for distortions to the positions of the targets 33, 34 in the x and y axes. Other occurrences in the manufacture of pcbs are translation in the xy plane between layers of the pcb, and rotation in the direction indicated by arrow r of individual layers. The targets 33 are located around the edge of the pcb as distortion is at its greatest at the edge. However, if the pcb included a number of circuits, for example four circuits may be located on the pcb, then targets may also be located in each layer between the circuits.

Figure 3:
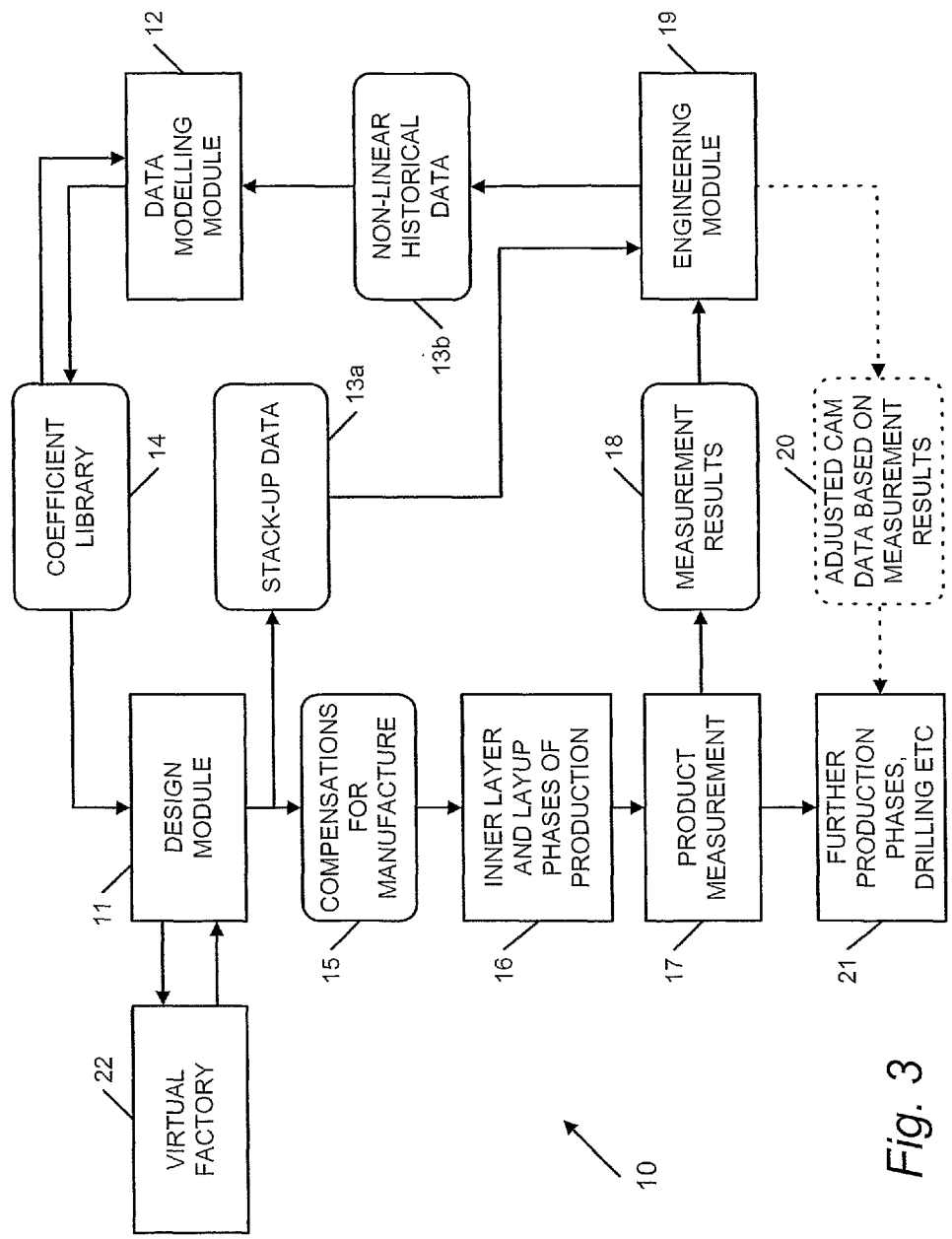
FIG. 3 is a block diagram illustrating the process of an embodiment of the invention.

FIG. 3 is a block diagram illustrating the components of a registration system 10 and their interaction. The registration system 10 comprises a design module 11 and a data modelling module 12 each of which communicates with a coefficient library 14 and individually with databases 13a (stack-up data) and 13b (non-linear historical data) respectively. Information relating to the design and manufacture of a pcb is entered into the design module and is generally provided by a pcb designer. In some circumstances the pcb designer provides only very limited information, which may be no more than the track layout, the separation between copper tracks, and overall thickness, whereas other designers may add more detailed information such as specifications of materials to be used. Where no material specifications are provided by the pcb designer, material specifications must be manually selected and inputted to the system using a virtual factory 22, which provides inter alia a user interface. The design module 11 communicates with the database 13a of stack-up data and the co-efficient library 14, the co-efficient library also communicating with the data modelling module 12. As can be seen from the illustration, communication between the data modelling module 12 and the coefficient library 14 is two way, meaning that the data modelling module 12 can read coefficient information from the library 14 and can also write new coefficient information to the library. Communication between the design module 11 and the coefficient library 14 is one way. Information from the coefficient library 14 can be used by the design module 11 but not uploaded from the design module to the coefficient library 14.

Compensation step 15 indicates that compensations for manufacture are applied to the pcb design and put into a form readable by a computer operated manufacturing system (CAM) of the type used in the manufacture of the pcb at product manufacture step 16 in which one or more inner layers 31, 35, 36 are formed and then bonded in stack formation in a layup phase described in greater detail below. These compensations are generated in the virtual factory 22 using warp and weft deviation equations defined below and are based on the materials selected for manufacture of the pcb, the copper distribution and separation between tracks and corresponding coefficients extracted from the coefficient library. A visual indication of distortion effects predicted by the virtual factory 22 may also be provided via the user interface. As well as being applied to the pcb design, the compensations, which will be applied to the pcb being manufactured, are written to the stack-up database 13a for subsequent use by an engineering module 19.

Typically, a plurality of cores, i.e. inner layers, of the pcb are manufactured individually by the product manufacture step 16 and are then laminated together. Following lamination, the actual location of the targets 33,34 on the pcb are measured at a product measuring step 17. The product measurement step 17 uses known techniques for measuring the accuracy of registration of features in the pcb using apparatus such as an X-ray co-ordinate measuring machine which detects targets 33,34 of which there are typically at least sixteen on each layer of the pcb. Measurement results 18 from the product measurement step 17 are transmitted to an engineering module 19 described below. The measurement results 18 for a production run are fed back to the non-linear historical database 13b. As will be described in greater detail below, optimised compensation values are generated, based on the measured results, and are used to update the coefficient library 14, and may be used to optimise further product manufacturing steps 21. The measurement results 18 represent the actual position of targets 33,34 after manufacture. Using the data modelling module 12, the predicted target positions can be calculated using the currently stored coefficient information and a comparison with the measurement results can be used to generate new co-efficient information for use in providing improved compensation values.

The engineering module 19 is connected to the database 13b of non-linear historical data, and the product manufacturing process 21 which is down stream of the product measuring step 17.

When product measurement step 17 is complete and the actual positions of the targets 33,34 are known, it may be advantageous to perform further manufacturing steps, such as the drilling of holes, in relation to the actual measured positions of the targets. In a further step 20 adjusted CAM data based on the measurement results is applied to further production phases 21. However, if the measurement results show that the actual positions of the targets 33,34 are within an acceptable tolerance, the application of adjust CAM data may not need to be applied. The adjusted CAM data is for this reason represented in broken lines in FIG. 3 as an optional feature.

Design Module

Figure 4:
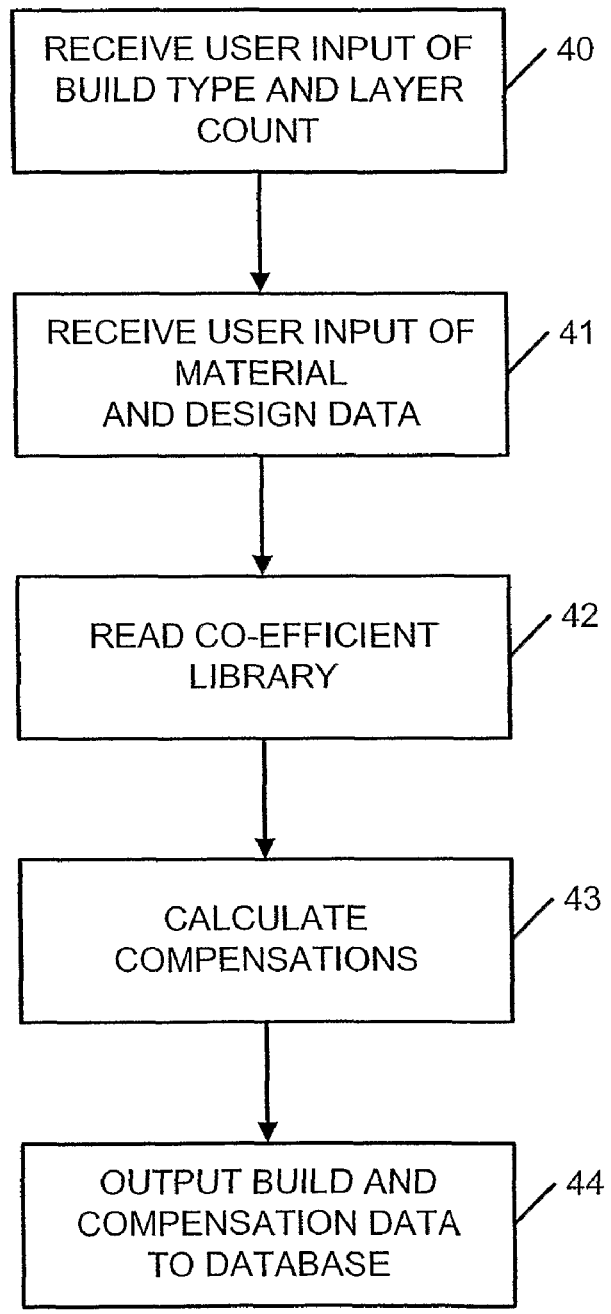
FIG. 4 is block diagram illustrating the process of the Designer Module shown in FIG. 3.

FIG. 4 illustrates the process operated by the design module 11, which includes the following steps:

at input step 40, the design module receives the input of user data relating to the type of pcb and the number of layers in the pcb;

at input step 41, the design module receives the input of user data relating to the materials used in the pcb and other design data such as track separation, copper distribution, etc;

at reading step 42, the design module reads coefficient data from the coefficient library 14;

at calculating step 43, the design module calculates the compensations in the virtual factory using the data from steps 40 to 42 and the warp and weft deviation equations; and at output step 44, the design module outputs the build data and compensation data, that is the combination of all the data from steps 40 to 43 to the stack-up database 13a and to a computer aided manufacturing system for use in product manufacturing step 16.

By using the design module 11, an engineer or designer may also analyse the effects of using different materials or different combinations of materials in the manufacture of a specific circuit and may view the results via the user interface.

Data Modelling Module

FIG. 5 illustrates the process operated by the data modelling module 12 in order to process the measurement results for optimising the coefficients used in the model and thereby empirically improve the accuracy of modelling distortion in the manufacturing process and the accuracy of compensations calculated by the design module 11. Operation of the data modelling module 12 can form part of the process illustrated in FIG. 3 where the steps described below are operated automatically whenever the system is used.

The process operated by the data modelling module 12 includes the following steps:

a reading step 50 of reading process, materials, design and deviation data from the non-linear historical database 13b;

a reading step 51 of reading data from the coefficient library 14 and extracting the coefficients relating to process, material and copper distribution most closely matching the design;

a calculating step 52 of extracting each record from the non-linear historical database 13b and predicting warp and weft deviations;

a calculating step 53 of calculating the error of the predicted value for each entry in both axes, that is the difference between the predicted value and the actual value for each target;

a calculating step 54 of calculating the error squared for each entry in both axes;

a calculating step 55 of calculating the sum of errors squared for both axes;

an optimising step 56 of applying iterative least squared optimisation to each axis in order to produce the lowest possible sum of errors squared by refining non-linear distortion coefficients for each process, material and copper distribution variable; and a saving step 57 of saving improved non-linear distortion coefficients to the coefficient library to replace existing values.

If the sum of errors squared is reduced, the corresponding coefficient values are improved and the coefficient library 14 is then updated to provide more accurate calculations of compensation by the design module 11 and hence better registration in subsequent manufacture of pcbs. If the sum of errors squared is not reduced, the coefficient library 14 is not updated. As a consequence the coefficient library 14 is only updated with data which is at least better than currently held data.

One least squared optimisation technique suitable for use in the optimising step 56 is Powell's method. Similarly, genetic algorithms and simulated annealing may be used to perform the least square optimisation.

Engineering Module

The engineering module 19 is associated with the CAM equipment and process. The process carried out by the engineering module 19 includes the following steps as shown in FIG. 6:

A sampling step 61 of receiving sample measurements of a product after an inner layer production phase and laying phase giving the position of copper targets 33,34 on each layer of the pcb, typically sixteen per layer, obtained using a non-contact co-ordinate measuring machine, and saving the results to a data storage device;

a data entry step 62 of receiving user entered details of the part being manufactured including any design rules;

a measurement step 63 of reading the positions of the copper targets and their nominal values from the measurement machine for each pcb of the batch;

a calculating step 64 of calculating the deviation of the actual position from the nominal position for each target 33,34;

a calculating step 65 of calculating for each point the deviation of the actual position from the predicted position;

an output step 66 of outputting the deviation calculated in step 65 to the historical database 13b as a separate record for each measured point;

a receiving step 67 of receiving user input to determine which layers require adjusted CAM data for subsequent processes (for example adjusted co-ordinates for drilling);

a calculating step 68 of calculating modified grid co-ordinates for use in a compensation file; and and output step 69 of outputting a compensation file created in step 68 for use by CAM system to modify subsequent process tooling, such as tooling required for drilling, plating and outer layer processing.

The engineering module 19 provides for these further production phases 21 to be modified to take account of errors occurring in earlier manufacturing steps 16. For example the compensation file of calculating step 68 may compensate the position of a drill such that the drill makes a hole avoiding rather than interfering with a feature whose position deviates from its nominal position. The compensation file referred to in calculating step 68 corresponds to the adjusted CAM data 20 of FIG. 3.

Distortion Models

Figure 7A:
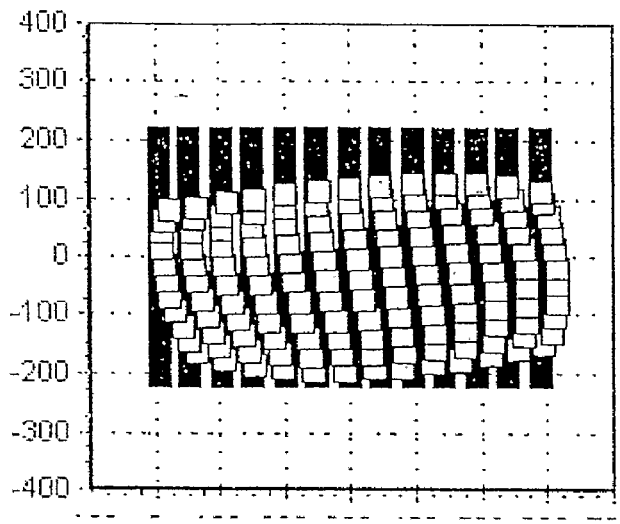
FIGS. 7a to 7c illustrate sample distortion models.
Figure 7B:
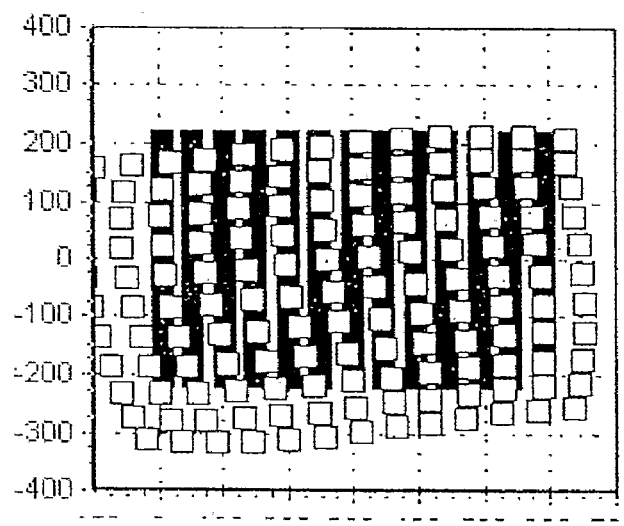
Figure 7C:
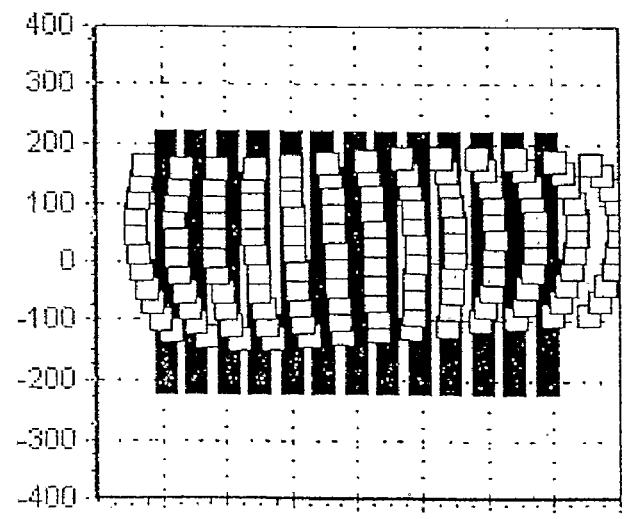

FIGS. 7a to 7c illustrate distortion models in which a regular grid of black squares illustrate the nominal positions of targets 33,34 and the displaced white squares illustrate the positions calculated from the model results.

Calculation of Stretch Compensation Values

The aim in pcb manufacture is to have post manufacture a pcb where all features are at their desired nominal locations. It is widely understood that the different layers of pcbs are distorted during manufacture so that if during manufacture the features are applied in their nominal locations, post manufacture they will be displaced from their nominal locations. The compensation applied to a particular feature location desirably places a given feature in a position during manufacture which will result in the component being in its desired position post manufacture, i.e. the compensation value applied to the feature position compensates for the distortion.

Non-linear Compensation Techniques

According to a first embodiment, in order to generate a non-linear compensation prediction, coefficients are calculated by correlation of distortion models and material selection using parametric optimisation techniques.

The distortion model of the present example enables modelling of material movement by the use of cubic spline interpolation of one dimension at a time, i.e. in the x-axis and the y-axis, to obtain a two dimensional distortion model for each layer of the pcb. In practice, the distortions in the x and y axis are measured. A plot of the distortion in the x-axis is made as a function of x, a plot of the distortion in the y-axis is made as a function of y. For each plot the next step is to fit a cubic polynomial equation thereto. The distortion of each layer is represented by a bi-polar (x, y) cubic spline which gives a set of parameters defining a surface, which surface represents the distortion of a layer. The cubic spline interpolation for each layer of the panel provides in effect a three dimensional model of material movement in the pcb.

Bicubic Coefficient Equation

Each bicubic coefficient $A_r$-$J_r$, $A_f$-$J_f$ is a function of Average offset, press cycle, bond sequence, core, preg above, preg below, (copper above the core x copper coefficient), and (copper below the core x copper coefficient).

The bicubic coefficient equation is used to generate each of the coefficients $A_r$ to $J_r$ (warp) and $A_f$ to $J_t$ (weft) for the Non-linear optimisation equations described below. Examples showing how the coefficients $A_r$ to $J_f$ are arrived at are set out below:

$$A_r = A_{r\,offset} + A_{r\,core} + A_{r\,prepreg\,above} + A_{r\,prepreg\,below} + A_{r\,press\,cycle} + A_{r\,bond\,sequence}[A_{r\,copper} \times \text{Cumulative\_Copper\_Above}] + [A_{r\,copper} \times \text{Cumulative\_Copper\_Below}]$$

$$B_r = B_{r\,offset} + B_{r\,core} + B_{r\,prepreg\,above} + B_{r\,prepreg\,below} + B_{r\,press\,cycle} + B_{r\,bond\,sequence} + [B_{r\,copper} \times \text{Cumulative\_Copper\_Above}] + [B_{r\,copper} \times \text{Cumulative\_Copper\_Below}]$$

$$C_r = C_{r\,offset} + C_{r\,core} + C_{r\,prepreg\,above} + C_{r\,prepreg\,below} + C_{r\,press\,cycle} + C_{r\,bond\,sequence} + [C_{r\,copper} \times \text{Cumulative\_copper\_Above}] + [C_{r\,copper} \times \text{Cumulative\_Copper\_Below}]$$

Data relating to the copper distribution of the panel is obtained from an information grid which represents a layer and which provides for correlation of copper thickness with a particular location.

The copper distribution data is used to calculate the values of parameters Cumulative_Copper_Above and Cumulative_Copper_Below. The parameter Cumulative_Copper_Above relates to the upper surface of a layer and, for a given xy coordinate of a fiduciary point on the layer, can be arrived at by drawing a straight line from the centre of the layer to the coordinate xy and relating positions along the line to the information grid which indicates for each position whether copper is present or copper is not present. A summation along the line then provides an indication of copper density relative to the centre of distortion for that xy coordinate. Similarly the parameter Cumulative_Copper_Below for a given xy coordinate relates to the density of copper on the lower surface of the layer.

Different values will therefore exist for the variables Cumulative_Copper_Above and Cumulative_Copper_Below for each of the fiduciary points such as points 33 and 34 in FIG. 2.

Non-Linear Compensation and Optimisation (Warp and Weft Deviation) Equations

The equations used to derive the compensation values are also used to optimise the bicubic coefficients, the difference being that, when used in derivation of the compensation values, the equations are used to calculate values of Warp deviation and Weft deviation, whereas when optimising the bicubic coefficients the values of Warp deviation and Weft deviation are known and the equation is solved to reduce error of these deviation values towards zero. With reference to the derivation of compensation values from the Warp and Weft deviation equations, the compensation values are the inverse of the calculated deviations, i.e. the equation calculates the position to which a particular point in the initial design data on the board will deviate. The compensation value, which is the inverse of the deviation, is applied to change the location of the point in the design data to take account of the expected amount of distortion.

The Warp and Weft deviation equations are:

$$\text{Warp Deviation} = A_r + B_r \times \text{warp distance} + C_r \times \text{weft distance} + D_r \times (\text{warp dist})^2 + E_r \times (\text{weft dist})^2 + F_r \times (\text{warp dist} \times \text{weft dist}) + G_r \times (\text{warp dist})^3 + H_r \times (\text{weft dist})^3 + J_r \times (\text{warp dist}) \times (\text{weft dist})^2; \text{ and}$$

$$\text{Weft Deviation} = A_f + B_f \times \text{warp distance} + C_f \times \text{weft distance} + D_f \times (\text{warp dist})^2 + E_f \times (\text{weft dist})^2 + F_f (\text{warp dist} \times \text{weft dist}) + G_f (\text{warp dist})^3 + H_f (\text{weft dist})^3 + J_f \times (\text{warp dist}) \times (\text{weft dist})^2$$

Where the:

warp distance is the distance from the centre point of the board to a desired point as defined by the pcb designer in the warp direction;

weft distance is the distance from the centre point of the board to a desired point as defined by the pcb designer in the weft direction.

This embodiment of FIGS. 1 to 6 provides a registration system and method which generates non-linear compensation values for application during manufacture of a pcb. As distortion in the manufacturing process is in fact non-linear, applying a non-linear compensation will result in more accurately modelled predicted distortion and hence improved compensation to provide more accurate registration. Further the disclosed system and method provide for the continuous improvement of compensation coefficients resulting in the application of more accurate compensation values in pcb manufacture, thereby providing continuous improvement in registration.

Figure 8:
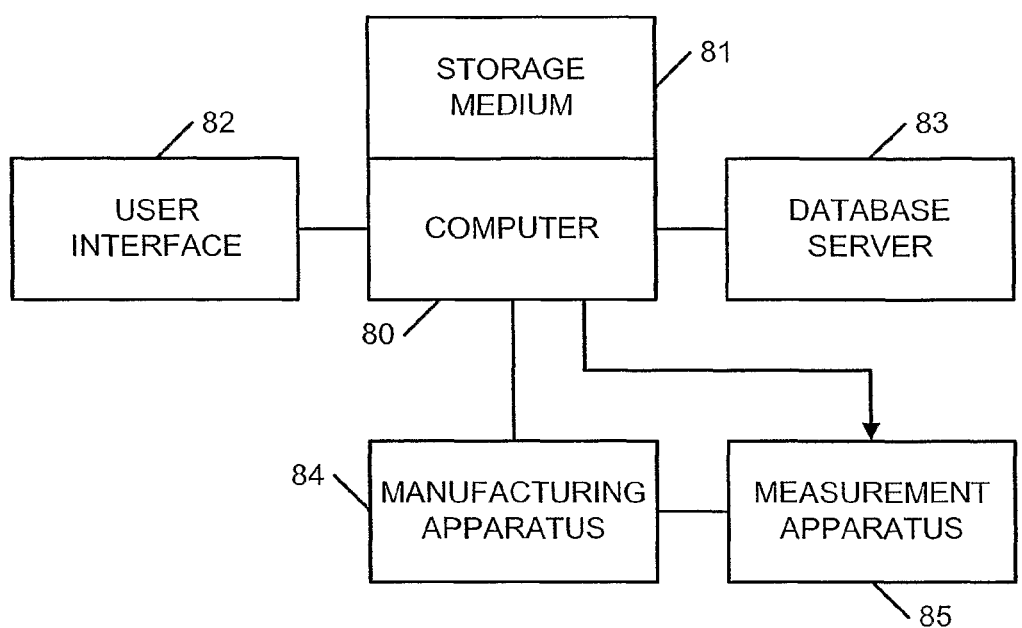
FIG. 8 is a schematic diagram of hardware according to an embodiment.

FIG. 8 is a schematic diagram of hardware required for an embodiment of the present invention and comprises a computer 80 with storage medium 81 for the storage of programs and data and a user interface 82. The computer 80 is connected by network or otherwise to a database server 83 thereby providing access to all databases to be utilised. The computer 80 is shown connected to manufacturing apparatus 84 which may comprise a series of manufacturing stations controlled by one or more computer aided manufacturing systems. Measurement apparatus 85 is also provided to obtain measurements from manufactured products at one or more stages in production and to communicate measurement data to the computer 80.

As described in the embodiment of FIGS. 1 to 6, an important feature is the way in which data used in the modelling process to predict distortion occurring during production is itself optimised and updated on the basis of measurements carried out on the production output. By comparing the actual distortion arising from production with the predicted distortion, the resulting error can be processed in a feedback loop manner to update the model data stored for future reference. Since a manufacturer of products such as pcbs will typically be required to provide production runs with different layout and materials design specification, a library of model data can be accumulated over time and the stored model data may be progressively optimised.

Figure 9:
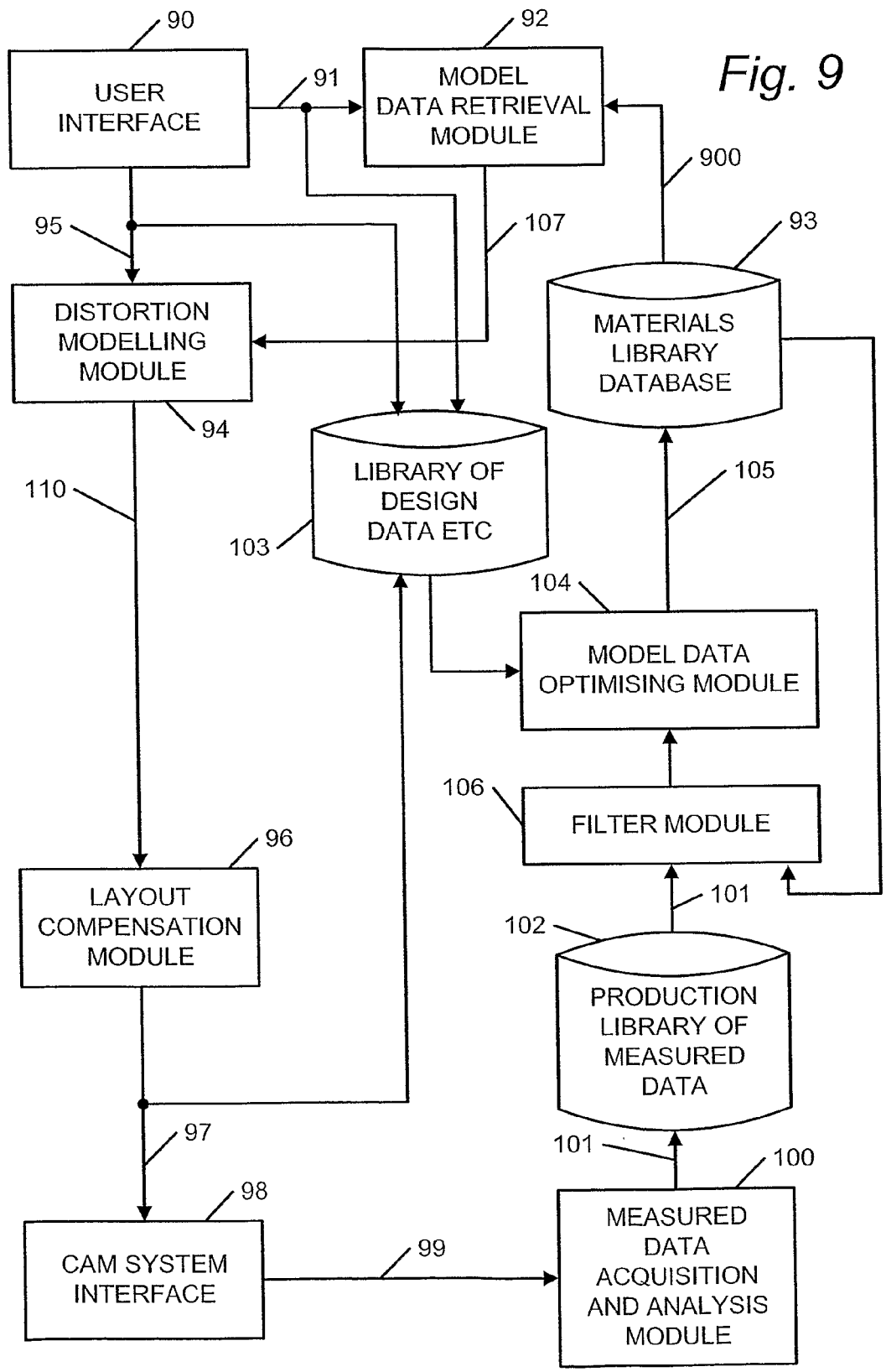
FIG. 9 is a schematic diagram of software components for use in an embodiment in which there is feedback to update the materials library database.

FIG. 9 shows schematically the software components which play a part in this feedback process.

A user interface 90 forwards design materials data 91 to a model data retrieval module 92 which comprises a look-up table. The design materials data in the preceding embodiments comprise six data items, the first data item "core materials" characterises the core materials used in the core according to resin supplier, thickness and the type of construction in terms of woven layer. For each of a number of possible combinations, a unique identifier is derived to characterise the core materials so that the identifier can be used as a key value when accessing model data using a simple look-up table.

The second data item is "prepreg type", characterising the type of prepreg according to the supplier, the type of resin system utilised, the glass cloth style and the resin content. Again, for each combination of the above a unique identifier is identified to serve as another key in the look-up table.

The third data item is "copper pattern" characterising the density of copper pattern on each side of the core and derived by taking a map of the core and working out how much copper there is relative to datum positions on the core. From this a single coefficient is generated, expressed as a percentage ratio of copper to etched space which will comprise the pattern on each side of the core. An average of the two ratios is then taken. The ratio is then quantised to obtain in effect a unique identifier.

The fourth data item "press cycle" relates to the lamination press cycle to be utilized. The temperature and pressure required for the specific press cycle used in production is identified and matched against ranges of values identified by respective identifiers to arrive at a single identifier.

The fifth data item "bonding sequence" relates to the number of times the bonding process is to be carried out in a bonding sequence in which inner layers or cores are bonded together in stack formation. Typically this is between 1 and 5. The identifier will therefore represent the number of times in this range.

The final data item "warp and weft direction" defines the warp and weft direction relative to the long access of the pcb.

This design materials data 91 in the form of a set of six identifiers is communicated to the model data retrieval module 92 which accesses a materials library database 93 using the six identifiers to look up a set of model data values 900 to be input to a distortion modelling module 94. In the previously described embodiment, the distortion modelling module is an empirical model requiring model data values in the form of coefficients for the non-linear optimisation equations. The model data retrieval module 92 generates the coefficient data 107 which is the input to the distortion modeling module 94. The user interface 90 also communicates layout data 95 to the distortion modelling module 94. In the case of the preceding embodiment, this layout data includes the position of fiduciary points 33, 34 which can be measured after production to obtain data representative of the amount of distortion.

The distortion modelling module 94 produces modelled distortion layout information 110, thereby predicting expected movement of the fiduciary points in the layout data 95 and this information is utilised by a layout compensation module 96 which processes the layout data to obtain compensated layout data 97 in which the layout is redesigned so that the design features including the fiduciary points are moved by compensation amounts equal and opposite to the distortion amounts predicted by modelling with the intention of enabling the features including fiduciary points to be at their intended positions after production without error.

This compensated layout data 97 is input to a computer aided manufacturing system interface 98 to be used as the basis for controlling manufacturing apparatus 84 during a production run.

After the production run, the pcb is measured by measurement apparatus 85 and measured data 99 communicated to a measured data acquisition and analysis module 100 which determines error data 101 representative of the difference between the actual distortion arising from manufacture and the predicted distortion. This measured data 99 and error data 101 is stored in a production library of measured data 102.

The design materials data 91 and layout data 95 for each production run are stored in a library of design data 103 and, for a given production run, this information together with corresponding error data 101 is acquired and processed by a model data optimising module 104.

The model data optimising module 104 determines whether any variation in the currently used model data values stored in the materials library database 93 would have resulted in a better prediction of the actual distortion as measured. If this is the case, the model data values stored in the materials library database 93 for the corresponding design materials data 91 appropriate to this production run are updated with optimised model data values 105 to thereby optimise the operation of the distortion modelling module 94 during future production runs.

The materials library database 93 may be updated directly after each production run on the basis of the optimised model data values 105 calculated from the measured data 99. In an alternative embodiment, the error data 101 input to the model data optimising module 104 is filtered over time so as to be based on measured data 99 from a series of production runs. In this way the effect of spurious production errors can be minimised. Statistical filters are known for such purposes and may be readily adapted to filter the data accordingly. This process is represented in FIG. 9 by filter module 106. In a preferred embodiment, measurements relating to each fiduciary point in each layer are processed separately to update records in the materials library database 93, each layer may therefore have sixteen or more records. Taking a subset of the database records relating to use of a specific core or prepreg material, the standard deviation of calculated errors (i.e. the difference between predicted position and measured position) is then calculated. Error data is then filtered to reject data regarded as being unreliable or spurious by comparing the data with a threshold which in the present example is three times the standard deviation. The remaining error data in the subset is used to refine or optimise the parameters stored in the materials of library database in relation to the specific core or prepreg material type.

When the system is initially created, the materials library database 93 will not contain data which has been optimised as a result of any production fun. Over time, the data entries for different combinations of design materials data 91 will be progressively updated until the data is optimised for all or most of the possible combinations of design material data.

At the initialisation stage, in the case of an essentially empirical model described above with reference to FIGS. 1 to 7, no useful values of coefficients are available and the initial values stored in the database may be set to zero. In an alternative arrangement, in which the distortion modelling module 94 is based on a theoretical model, the initial values in the materials library database 93 may be actual values identified according to known physical properties of the materials, such as modulus of expansion. Nominal values populating the materials library database 93 at initialisation will be progressively replaced with optimised model data values 105 in order to provide the distortion modelling module 95 with a better estimate of the parameters required for modelling.

Figure 10:
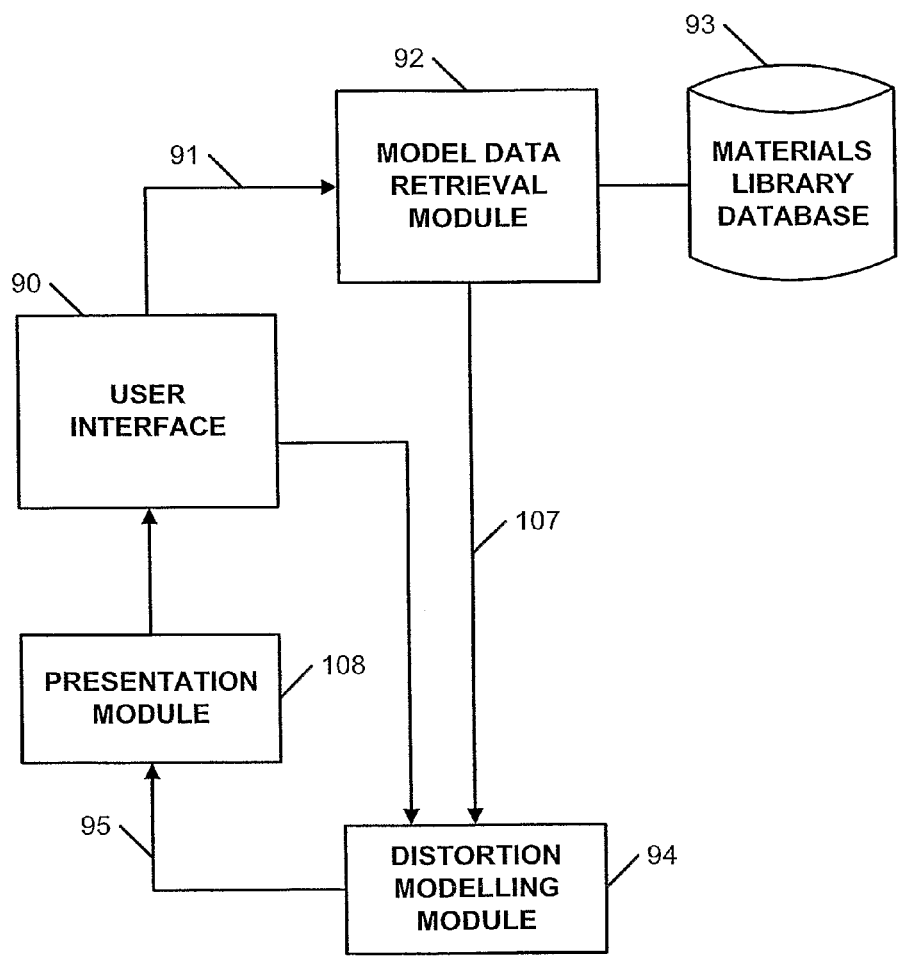
FIG. 10 is a schematic diagram of an embodiment including a presentation module.

The accumulated information in the materials library database 93 after production runs have been carried out using different combinations of design materials data 91 and layout data 95 is particularly useful to the designer wishing to visualise the effects of distortion on a proposed set of layout data and design materials data. The information provided by the distortion modelling module 94 may be input to a presentation module 108 as shown in FIG. 10 to provide the user interface 90 with a visual representation of the distortion effects which are likely to occur during production. The designer may then experiment with different layout designs for example or with different materials to visualise the relative effects of different options available to him. In this respect, the system 10 provides a further useful design tool to the pcb designer. Typically, the user interface will be provided with a screen display showing undistorted and distorted versions of the layout as shown in FIGS. 7*a* to 7*c*, the extent of distortion being exaggerated by a predetermined ratio to assist the user in gaining an appreciation of the manner in which the pcb will distort during production.

Once an accumulation of optimised data exists in the materials library database 93, a particular advantage of the system 10 is that the prediction of distortion obtainable from the distortion modelling module 94 is likely to be sufficiently accurate to enable the initial production batch to be produced with sufficiently accurate compensation to achieve required levels of tolerance for further stages of manufacture. This aspect of the system thereby removes the need for a prototype production run to initially gain knowledge of distortion effects. This is particularly important when small batches of a particular design are to be produced.

Production Process

Figure 11:
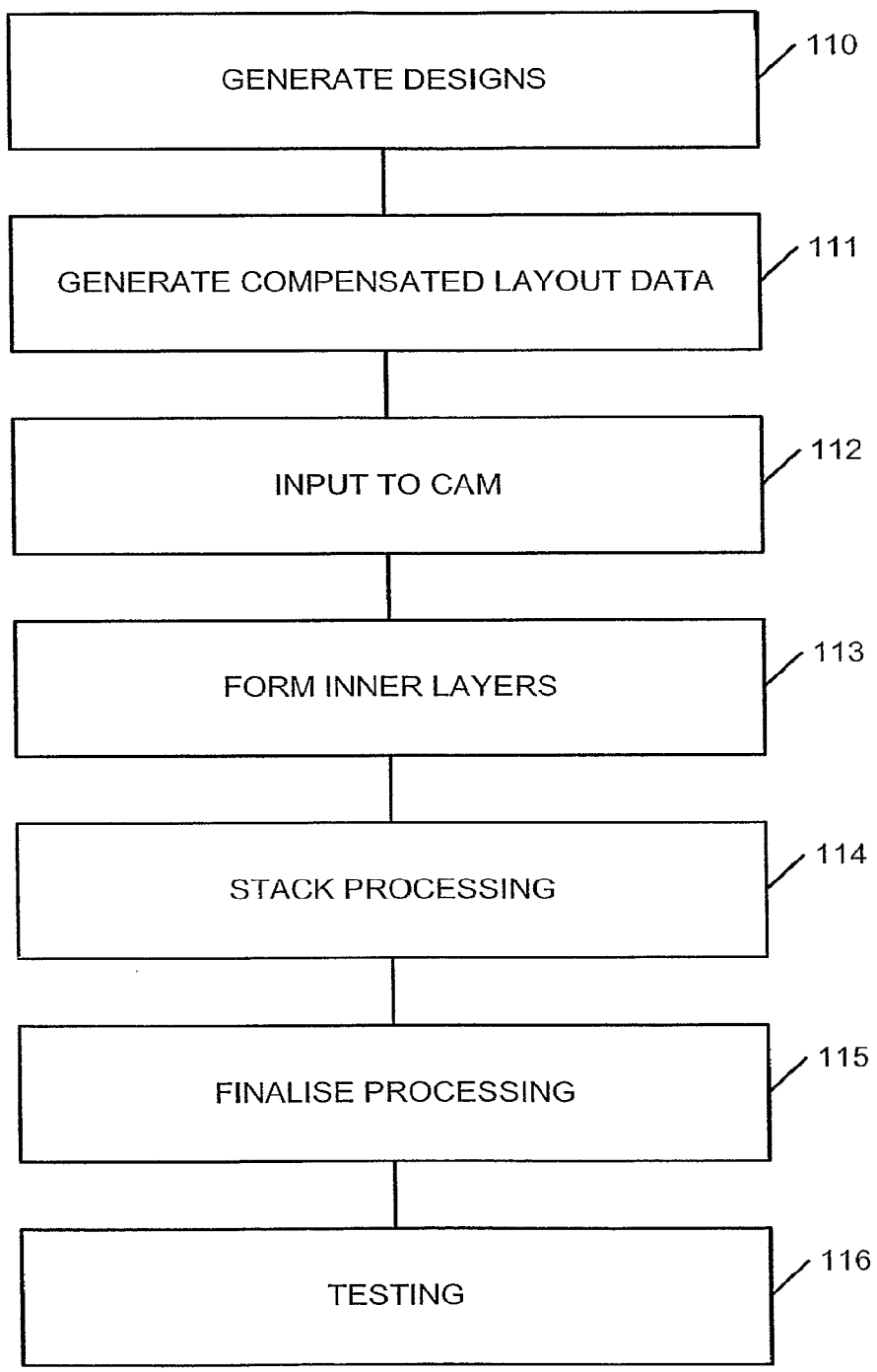
FIG. 11 is a flowchart for an overall production process.

The overall production process for a typical batch is summarised with reference to FIG. 11. The desired layout data 95 and materials data are generated in step 110 and the likely effects of distortion are modelled using the distortion modelling module 94 to generate at step 111 compensated layout data 97 which is then input at step 112 to a computer aided manufacturing system.

Figure 12:
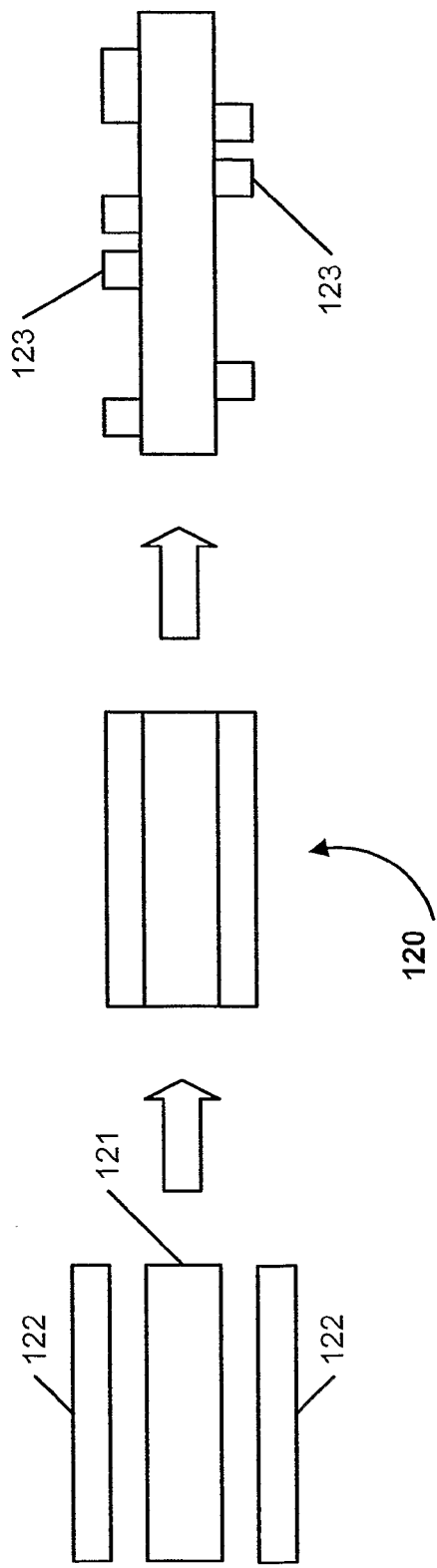
FIG. 12 is a schematic sectional elevation, not to scale, of an inner layer during production.

Initially an inner layer production step 113 is performed, shown schematically in FIG. 12;

copper clad laminate sheet 120 (typically acquired from an external supplier) is formed as a layer of uncured prepreg 121 with copper foil 122 on each face in a process involving heating the layers under pressure followed by controlled cooling. This necessarily results in stress being retained between the layers as the bonded layers cool because the layers become fused together at an elevated temperature and the layers have different coefficients of thermal expansion.

The copper clad laminate sheet 120 receives a photo resist layer which is exposed with an artwork image to define where copper tracks will be formed on the laminate. The exposed photo resist is then developed and the exposed copper etched. The remaining laminate is processed to strip the remaining photo resist leaving the desired copper pattern 123.

A post etch punch stage then follows in which slots are formed using an optical alignment tool for alignment during subsequent processing. Cameras of the optical alignment tool also provide measurements of the fiduciary positions.

Automated optical inspection, AOI, then follows in order to locate rejects and repair any open or short circuits which are repairable.

Then follows an oxide process of growing a rough surface on the copper as a key for the adhesion of resin during the lamination process. The inner layer, or core, is then complete. A number of different inner layers are typically produced for a given pcb and are to be arranged in stack formation.

A layup phase then begins.

Figure 13:
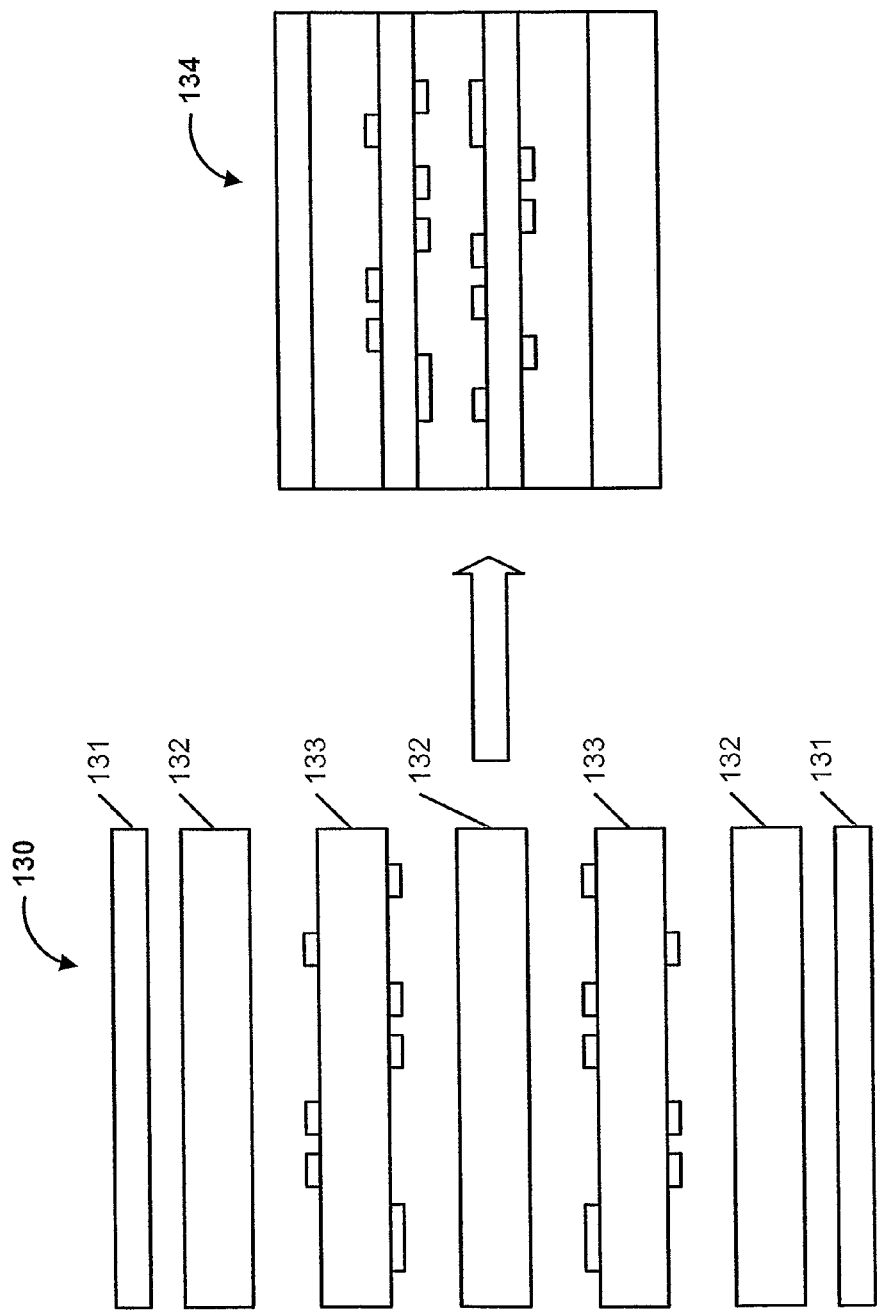
FIG. 13 is a schematic diagram illustrating the lay-up phase.

In the layup phase, a stack 130 of inner layers required for a given pcb is produced as shown in FIG. 13 and put into a press. The stack comprises outer layers 131 of copper foil, uncured prepregs 132 and etched cores 133. To maintain alignment of the inner layers in the press, the press may utilise pins locating the slots referred to above or alternatively the layers may be partially welded or rivetted together before insertion into the press.

The pressing phase for lamination then proceeds, heat and pressure being applied to cure and form a panel 134, otherwise referred to as a biscuit, to complete stack processing step 114.

To finalise processing (step 115 in FIG. 11), a trimming or de-flashing process then follows in which excess is removed from edges of the panel and an X-ray optimising process during which an X-ray system finds targets on inner layers and drills holes. Typically two holes are drilled to receive pins and a further hole is drilled to act as an orientation indicator. Holes are located intelligently after measurements in order to take account of the post production position of targets on different layers of the stack 130. Pins are then inserted into the resulting composite panels in the holes drilled in the previous phase.

Holes are then drilled for the purpose of forming interconnects between copper layers, an electroless copper plating processing being used to deposit a thin layer of copper on surfaces of the panel and linings within these holes.

An electrolytic copper plating process then follows in which a thicker layer of copper is deposited, this layer then being etched. The etching process involves putting etch resist on the surface, exposing with an image of required artwork, developing the unexposed area and etching copper to remove the remaining resist, thereby revealing copper pathways.

Finally, a solder mask comprising a protective layer is applied to the whole panel, exposed with a pattern, unexposed areas being developed, and the remaining solder mask being cured.

Metal finishing of the surfaces may then follow to protect exposed copper with tarnish resist material such as gold or organic coating.

A routing process may then follow in which individual circuits are cut from the panel. In a testing step, electrical testing for functionality is followed by an inspection step for detecting cosmetic defects.

The resulting package is then ready for receiving components.

As previously mentioned, the step 111 of generating the compensated layout data 97 for final production may in some instances require a prototype manufacture of a batch of cores from which measurements can be taken in order to refine the data used in the model. Where sufficiently accurate model data exists, the prototype phase of layout compensation may not be required.

The above series of process steps typically requires moving the product between different processing stations to perform different tasks although in some cases more than one task can be integrated within a single processing station, the manufacturing apparatus 84 thereby comprising a series of processing stations under the control of a computer aided manufacturing system. This corresponds to the apparatus of FIG. 8 in which the manufacturing apparatus 84 comprises a series of manufacturing stations and is under the control of computer aided manufacturing software operated by the computer 80, using software stored in the storage medium 81.

It is therefore evident that the modelling and compensating software summarised in FIG. 9 can also be operated by the same system hardware as described in FIG. 8 in which computer 80 operates programs stored in the storage medium 81 and uses data accessed via database server 83 which provides access to each of the various databases utilised in the modelling process.

The above-described production process can be varied in a number of ways. Whereas some bcbs may be formed by laminating together a number of inner layers and then completing further production steps, multiple laminations may be required for certain applications where high densities of connectors are required, for example in mobile telephone applications, and such sequentially laminated products require particular attention to registration between layers. After a number of inner layers have been laminated to form a composite layer, the composite layer may be drilled and etched before being combined with one or more further composite layers in a further laminating process, the resulting composite layer being again subject to further processes of drilling, plating and etching before the final panel being completed. The number of times that lamination occurs in the overall process players a key role in determining the amount of distortion likely to occur and will require appropriate modelling and compensation at each stage.

Finite Element Modelling

The distortion modelling module 94 of FIG. 9 may in an alternative embodiment utilise a physical model of the core to model distorted layout information 95. An example of such a physical model will now be described.

Figure 14:
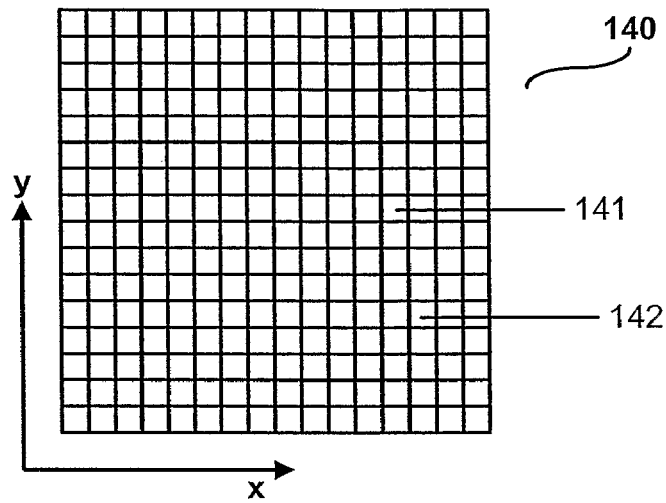
FIG. 14 illustrates a two-dimensional array of connected cells in a completed panel.

The model considers a panel as comprising a two-dimensional array 140 of connected cells as shown in FIG. 14 where a panel represented in plan view is divided into squares, each square constituting one cell. Each cell of the completed panel therefore comprises a number n of layers, each layer being represented as having a single material. One such cell 141 is shown in the example to contain nine layers whereas another cell 142 contains eleven layers. This difference in the number of layers in this example arises because cell 141 corresponds to a region of the panel in which two component cores are both etched to remove copper at positions coinciding with the cell position whereas cell 142 corresponds to a position in the panel in which both copper layers remain unetched. Copper layers are identified in each cell by reference 143.

Since the panel in this example is formed with two separate cores, laminated in a stack as shown in FIG. 13, corresponding arrays of cells are defined in each of the cores 144 and 145.

The relative sizes in the X and Y dimensions of cells having different combinations of layers will change as a result of the etching process in which copper is selectively removed from each side of the copper clad laminate since there are inbuilt stresses in the laminate arising from the elevated temperature at which the copper cladding fuses to the inner resin layer. Stress relief will occur at locations where copper is etched, or in other words those cells having fewer copper layers will change dimension as a result of the etching process whereas those layers from which no copper is etched will tend to remain stable. A further change in cell size occurs during lamination of the inner layers to form the bonded stock 130 because the lamination process involves a temperature cycle of heating to beyond the glass transition temperature of the resin material and then controlled cooling back to room temperature. Stresses are initially relieved while temperature is in excess of the glass transition temperature but then, during curing, the layers are fused together and stresses are established during cooling due to the differences in material properties of the different layers.

The approach taken in modelling is to assume that the resulting bonded panel comprises an array 140 of cells of equal size and which are constituted by layers which define exactly the required layout of the desired circuit design. The size of each cell during preceding production stages is then calculated by working backwards from this objective and, based on the modelled changes in cell dimensions, finite element analysis is used to determine the manner in which the panel deforms, i.e. the positions of each cell. If the layout is represented by a bit map in which each pixel corresponds to one respective cell, the end result of modelling will be a bit map in which each pixel is moved to the calculated cell position, and from this distorted image, a compensated layout may be derived, a separate compensated layout being derived for each of the separate cores in respect of which an initial layout was defined.

When modelling changes in cell size, the effects of neighbouring cells to which each cell is joined are ignored for the purpose of size calculation and are subsequently considered by implementing the finite element model which receives as one of its inputs the results of size calculation for each cell.

Figure 15:
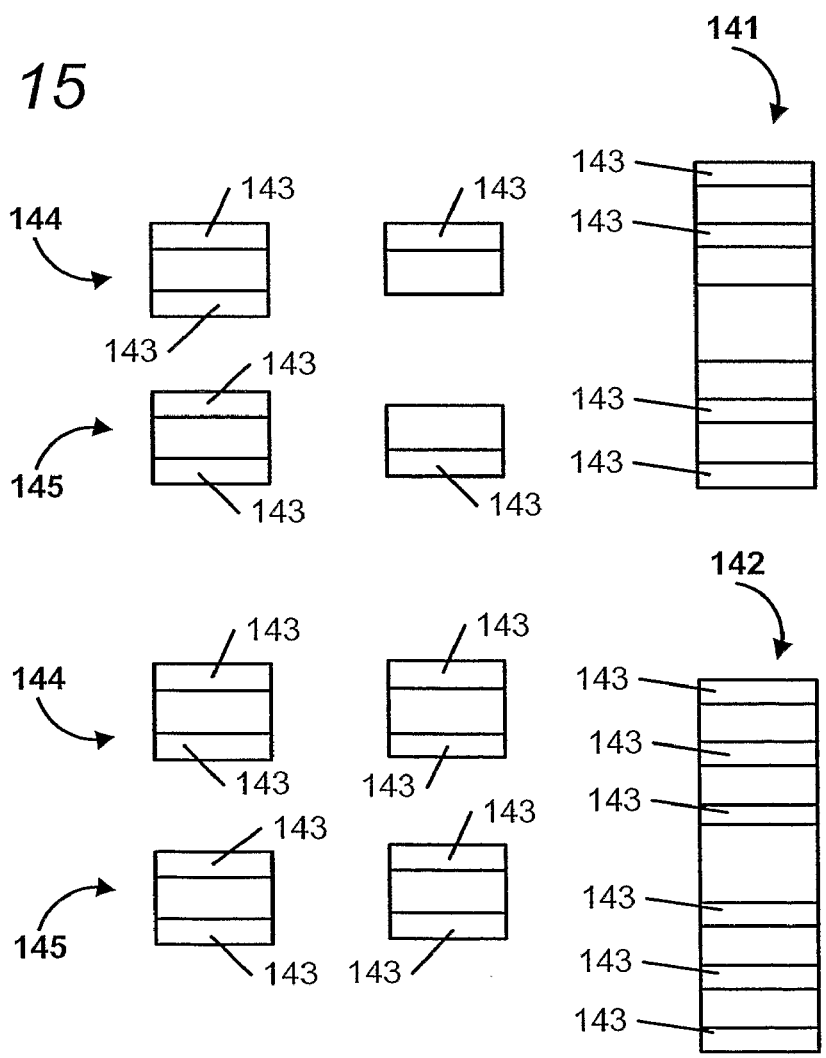
FIG. 15 is a schematic sectional elevation showing the layers contained in individual cells.

FIG. 15 illustrates schematically the way in which the modelling proceeds, beginning with the definition of cell size according to the dimensions of the two-dimensional grid 140 applied to the panel. The cell dimensions are typically set to have a linear dimension in the range of 100 microns to 1 millimetre.

FIG. 15 illustrates schematically how cells progress through the production phases. Two cells 141 and 142 selected from the grid 140 are shown in vertical section to reveal their layered construction. Cell 141 consists in the final panel of a total of nine layers of which there are four coppers layers 143. To the left of this representation of cell 141 are the representations of cells of the constituent cores 144 and 145 which initially, far left, comprises copper clad laminate with copper layers 143 on both top and bottom faces and subsequently, shown centrally, comprise only two layers after one of the copper layers has been etched away at that particular cell location.

Cell 142 however in this example corresponds to a location in the panel in which the etching does not remove copper form the cores 144 and 145 so that there remain eleven layers in the stack, including six copper layers 143.

It is therefore apparent that different cells of the array 140 will behave differently between heating a cooling processes since they comprise different numbers of layers.

Figure 16:
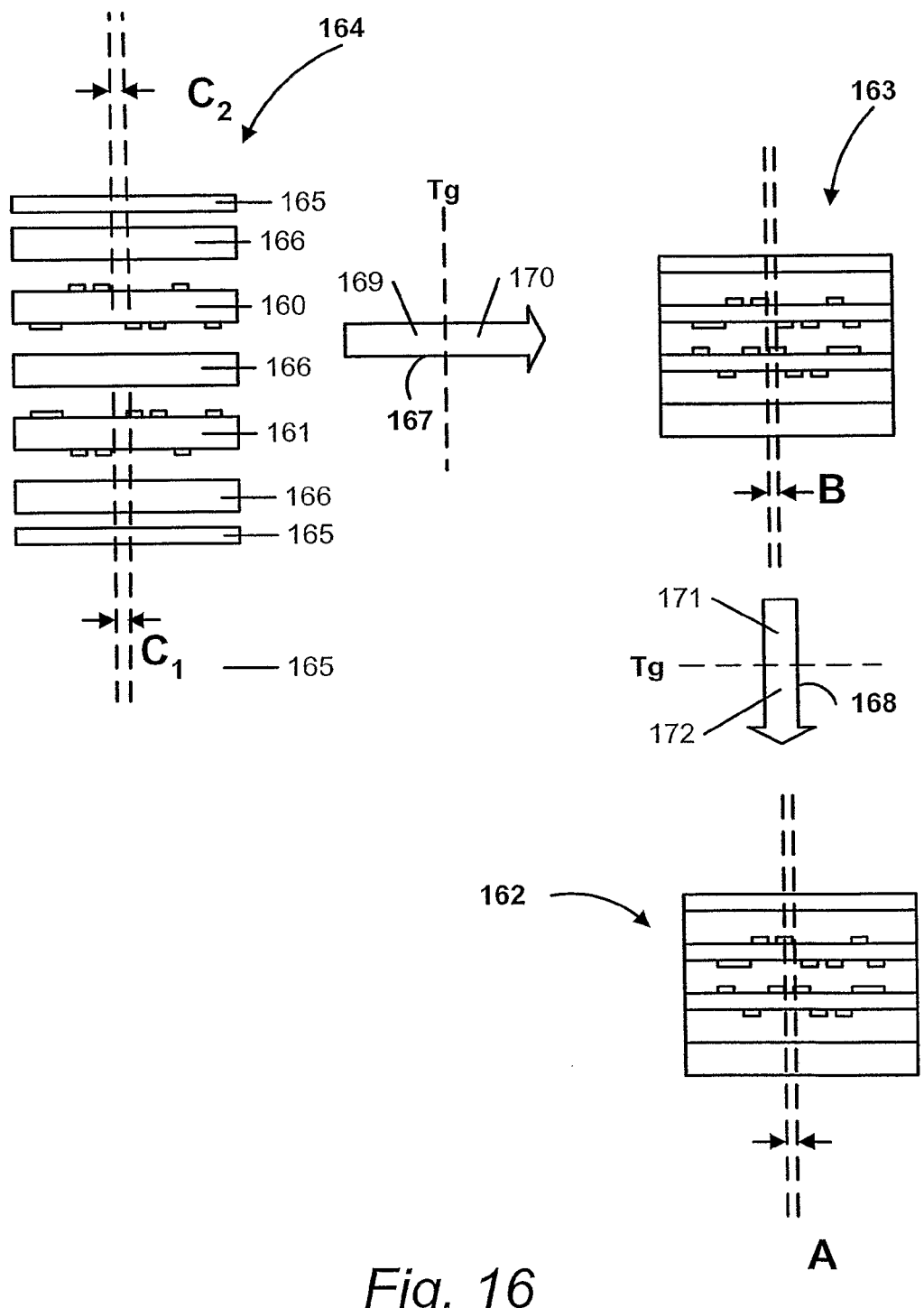
FIG. 16 illustrates schematically how one particular cell is processed in the lay-up phase.

FIG. 16 illustrates how one particular cell has a linear dimension in the X direction of A when the cell is in the bonded panel in its final state 162 at room temperature at the end of the stack processing process 114 of FIG. 11 for forming the panel. The same cell has a size B in the linear X direction when the panel is at an intermediate state 163 of being formed by lamination and at the point where the maximum temperature of the press cycle has been reached.

In a preceding pre-bonding state 164, the stack of separate copper foils 165, uncured prepregs 166 and etched cores 160,161 includes in this example two separate cores 160 and 161 for which the cell size is $C_1$ and $C_2$ respectively, for the same cell array position considered above.

In FIG. 16, the processes of heating the layers to form a bonded stack and controlled cooling of the bonded layers are represented by arrows 167 and 168 respectively. The process 167 consists of an initial phase 169 in which the layers of the stack are heated up to the glass transition temperature $T_g$ of the resin and a subsequent phase 170 in which the temperature continues to be elevated above $T_g$ to a maximum bonding temperature. The process 168 similarly consists an initial phase 171 in which cooling proceeds down to the glass transition temperature $T_g$ and a further phase 172 in which cooling progresses down to room temperature.

The model performs calculations starting from cell size A to arrive at values for cell size B and then cell sizes $C_1$ and $C_2$. These calculations are performed also for corresponding dimensions in the Y axis, X and Y being parallel to the grid axis of FIG. 14. In subsequent discussion, referred to calculating cell size A, B, C . . . should be understood to involve calculation for both X and Y dimensions. Equation 1 given below is used to calculate the change in dimension.

$$\Delta L_a = \alpha_a \cdot L \cdot \Delta T + \frac{\sum_{i=1}^{n} E_i \cdot t_i \cdot (\alpha_1 - \alpha_a) \cdot L \cdot \Delta T}{\sum_{i=1}^{n} E_i \cdot t_i} \qquad \text{Equation 1}$$

For n layers laminated together:
Where
$\Delta L_a$=dimension change for layer a
$\alpha_a$=Coefficient of thermal expansion for layer a
L=Cell Length
$\Delta T$=Change in temperature
$E_i$=Modulus of elasticity for layer i
$t_i$=Thickness of layer i
$\alpha_i$=Coefficient of thermal expansion for layer i Equation 1 is successively applied to derive changes in cell size for a number of phases of process and additionally to the process shown in FIGS. 17a and 17b of forming and etching copper clad laminate to enable the stress relief which occurs at etching to be quantified on a cell by cell basis.

Figure 18:
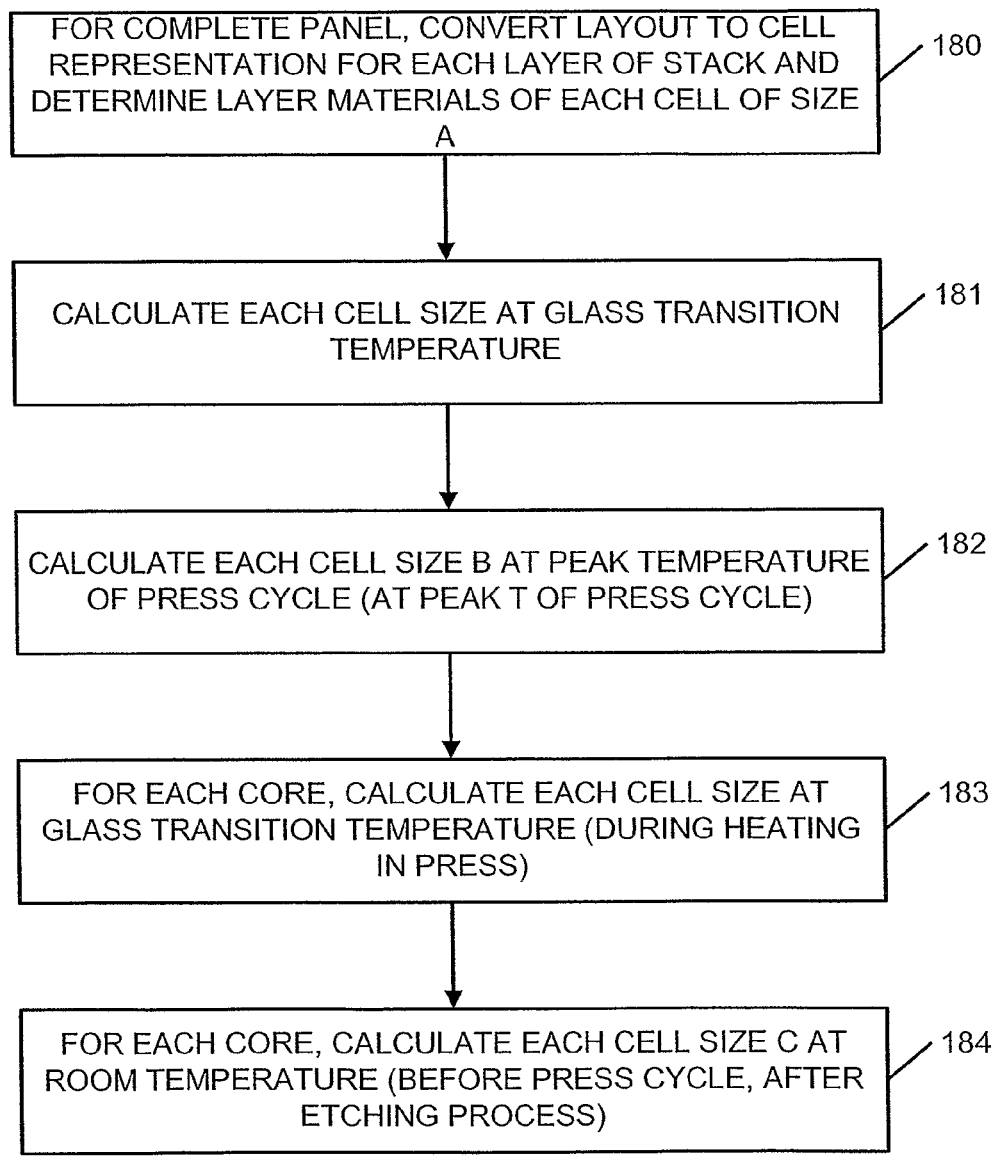
FIG. 18 is a flowchart summarising steps in calculating cell size.

FIG. 18 summaries the steps. At step 180, the complete panel in state 162 is analyzed to define an array 140 of cells where, for each cell, the number of layers and the composition of each layer is defined. Values of $\alpha_i$ and $E_i$ are obtained from stored model data in the materials library database 93.

At steps 181 and 182, for each cell, and for each one of the X and Y dimensions of the cell, the cell size B is calculated in two phases. A first step 181 models the cooling from the glass transition temperature $T_g$ to room temperature, the parameter ?T in this case corresponding to the temperature difference between $T_g$ and room temperature. The modulus of elasticity $E_i$ for the prepreg layers will be different in the X and Y directions according to whichever one comprises warp and weft directions of the prepreg material.

A second step 182 then follows in which the equation 1 provides the change of dimension corresponding to the transition from glass transition temperature $T_g$ to the maximum temperature $T_{max}$ of the press cycle. The data values of modulus of elasticity $E_i$ and coefficient of thermal expansion $\alpha_i$ of the resin are generally different above the glass transition temperature $T_g$ to the values below $T_g$.

The calculated size B of each cell is now considered to be the cell size when the materials were locked together during the lamination cycle and free of stress, corresponding to state 163 in FIG. 16.

The resulting data now comprises for each cell of the panel the linear dimensions in both X and Y direction for each cell considered in isolation, ignoring the effects of contiguous neighboring cells.

At steps 183 and 184, separate calculations are now performed for each of the cores forming the stack, in this example corresponding to the cores 160 and 161 in FIG. 16. The calculation for core 161 is to arrive at cell size $C_1$ in the state 164 where the cores together with copper layers and uncured prepregs are at room temperature in a stack ready for bonding. Corresponding calculations are separately done for cell size $C_2$ for core 160. In the following description, reference will be made to cell size C to describe the process applicable separately to each core.

The calculation proceeds in two separate stages, the first step 183 takes as its starting point the cell size B of the stack at state 163 and models the process of temperature transition from glass transition temperature $T_g$ up to the maximum temperature $T_{max}$ at state 163, this stage in the manufacturing process being represented by reference 170 in FIG. 16.

The value of cell length L in equation 1 corresponds to cell size B and values of $\alpha_i$ and $E_i$ are obtained from stored model data in the materials library database 93 for the appropriate core materials in each of the core layers.

The results of the calculation of cell size are then input to the next use of model equation 1 which models the phase 169 in FIG. 16 during which the temperature of the cores is elevated from room temperature to the glass transition temperature $T_g$.

Again, the values of $\alpha_i$ and $E_i$ in the model data will generally be different from those values applicable to the materials above the glass transition temperature $T_g$.

Step 184 therefore calculates for each cell the cell size C of etched cores at state 164 in FIG. 16. In other words, the calculated cell sizes $C_1$ and $C_2$ now represent the size of the cells after the inner layer etching process.

Figure 17A:
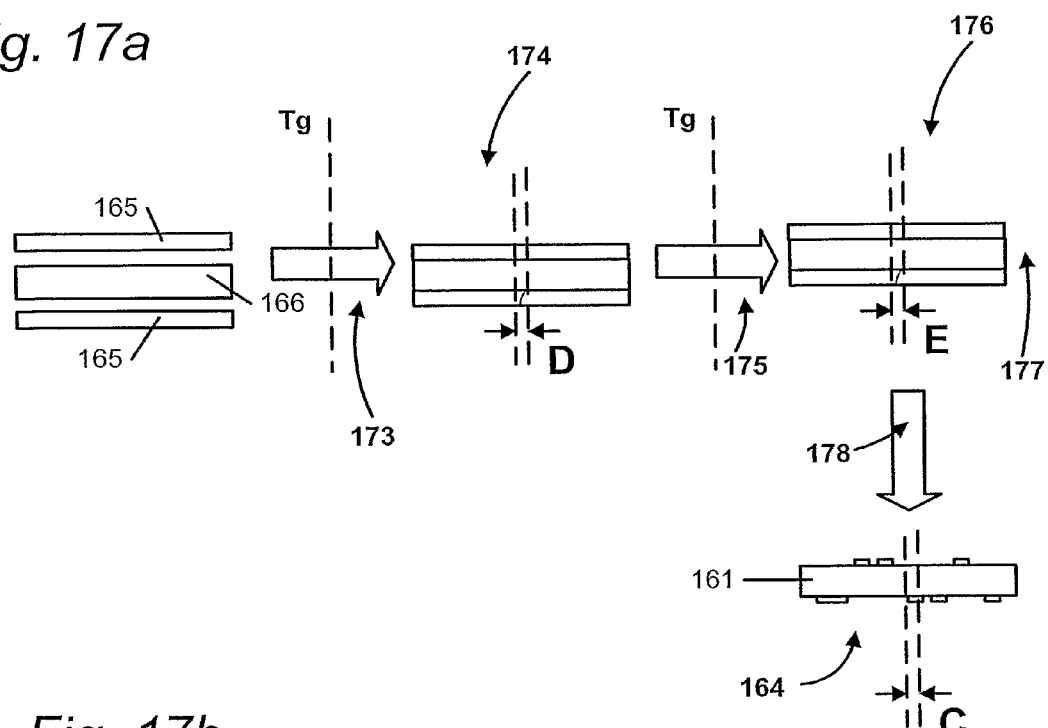
FIGS. 17A and 17B illustrate schematically how one cell progresses through copper-clad laminate formation and subsequent etching.

FIG. 17a illustrates the process at arriving at an etched core 161 including a laminating phase 173 in which uncured prepreg 166 and copper foils 165 are heated through glass transition temperature $T_g$ to a maximum temperature to arrive at a state 714, followed by a cooling phase 175 passing through the glass transition temperature $T_g$ to reach room temperature and arrive at state 176 where copper clad laminate 177 is now ready for etching. The etching process 178 has as it's end result the etched core 161. A difference in cell size in practice is observed in transiting from state 176 to the state 164 of the etched core at room temperature, this change in cell size occurring in a stress relief process. Stresses between the layers are not present in state 174 at the elevated temperature but arise in the phase 175 below the glass transition temperature when the fused layers progressively cool. The laminate will have a coefficient of thermal expansion which depends upon the coefficient of thermal expansion of each layer, the thickness of each layer, and the elastic modules of each layer. Etching is carried out after cooling to normal room temperature. As copper is etched from the laminate, the stressed material locally relaxes in the absence of the restraining effect of the copper which has been removed. Consequently, some cell sizes will change, even though there is no change in temperature at the time of etching corresponding to ?T in equation 1.

In order to be able to apply equation 1 to model this change in cell size, an assumption is made that if the pattern of etched copper has in fact been applied to the uncured prepreg 166 in state 174 at the maximum elevated temperature $T_{max}$ and the laminate then cooled to room temperature, the resulting cell size C would be the same as if the unpatterned laminated had been allowed to cool and was then etched with subsequent mechanical stress relief occurring.

Figure 17B:
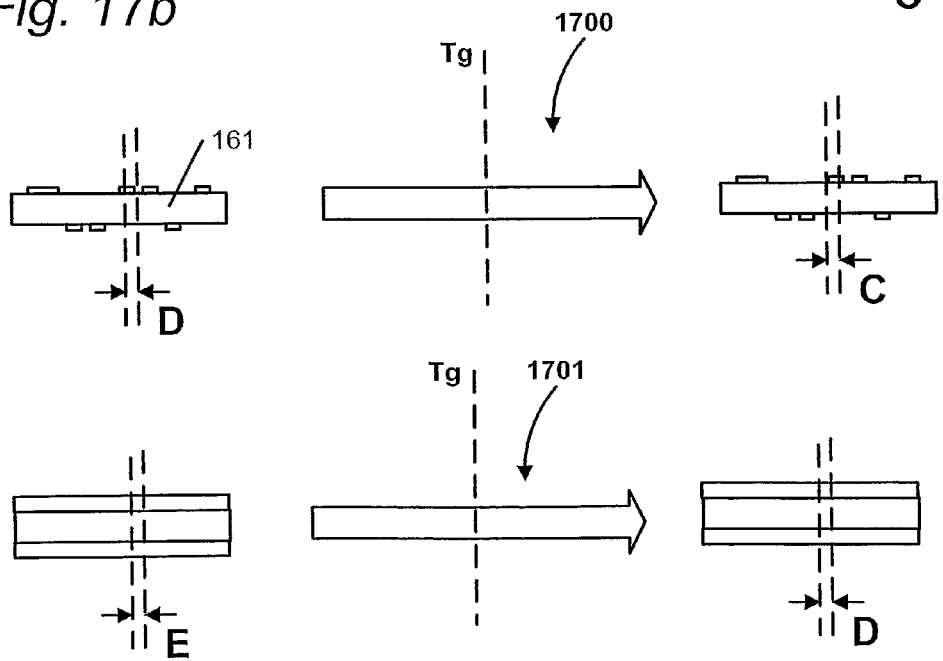

This hypothetical process is represented in FIG. 17b in which the cooling of core 161 from maximum elevated temperature during lamination to room temperature is represented by process 1700. A further process 1701 represents the process of heating laminate from room temperature to the maximum elevated temperature of the laminating process.

Figure 19:
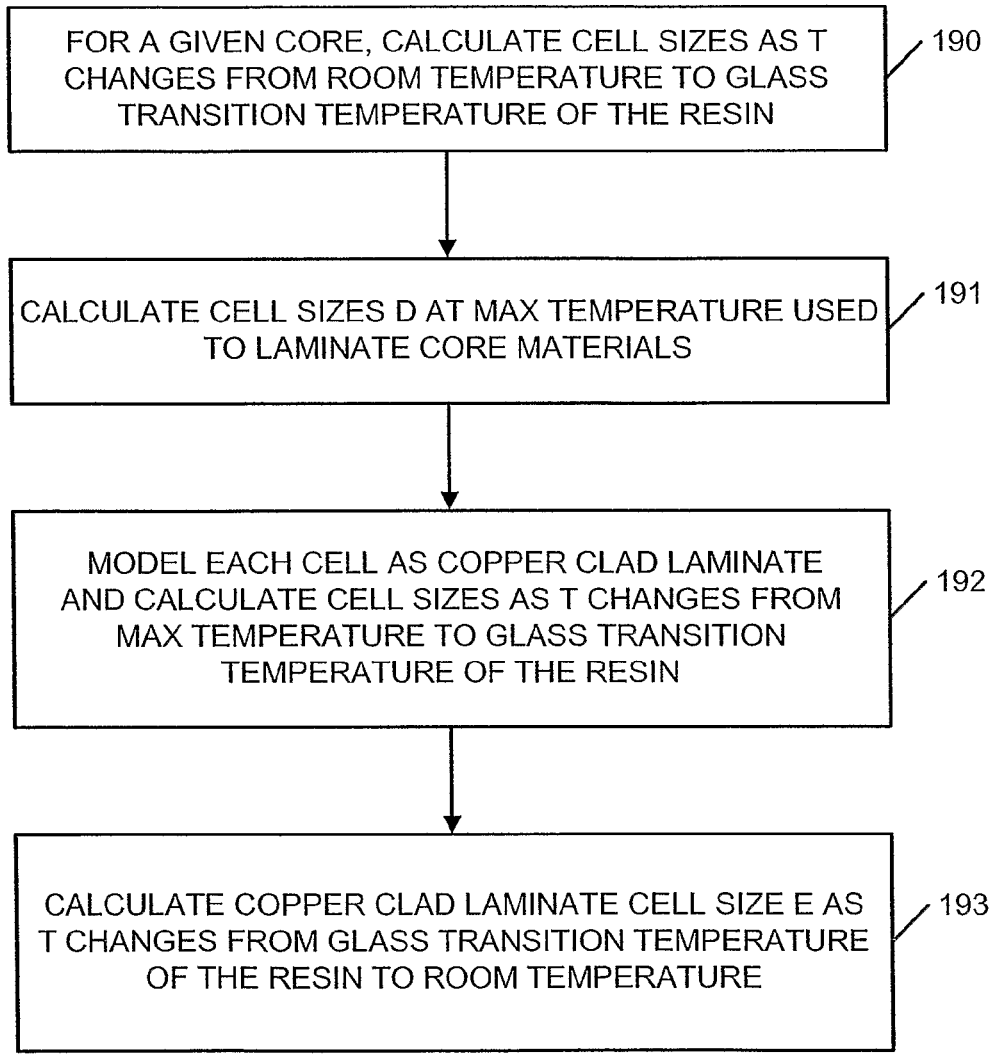
FIG. 19 is a flowchart illustrating the steps of calculating cell size in individual cores.

The model is again utilized in order to determine the size D for each cell in the X and Y dimensions in state 174 of elevated temperature during lamination. The process summarized in FIG. 19 begins at step 190 where, for a given core, each cell size is calculated as temperature changes from room temperature to glass transition temperature $T_g$ of the resin using equation 1. The initial size C of each cell and its physical makeup according to the etched core pattern are utilized to determine values to be input through equation 1.

At step 191, the cell sizes are again calculated at the maximum temperature $T_{max}$ of the lamination process used to laminate the core materials, again utilizing equation 1 based on the cell sizes of the preceding calculation and revised values of $a_i$ and $E_i$.

In other words, this phase is modeled as though the etching of the material had occurred at the peak temperature of the lamination process, at which point all stresses were zero, and the cooling of the core from this peak temperature to room temperature is assumed to arrive at the same change of cell dimensions as would be obtained in the actual process of allowing the copper clad laminate to cool and then apply the etching.

The resulting cell sizes D are now used as input to the model for calculating cell size E corresponding to copper clad laminate at room temperature in state 1702 of FIG. 17b.

At step 192, the copper clad laminate is modeled, each cell having the same number of layers and material content, to calculate cell sizes as temperature changes from the maximum temperature of the lamination process down to the glass transition temperature of the resin, and again the cell size is recalculated at step 193 to model the final stage of the copper clad laminate having a temperature change from glass transition temperature of the resin down to room temperature. This final cell size E indicates the size of cell of copper clad laminate that will produce a correctly sized cell A in the bonded panel. The resulting data therefore comprises cell sizes E in X and Y dimensions for each cell of array 140, calculated using a model which up to this point ignores the interaction between cells.

The manner in which finite element modelling is utilized to determine cell movement will now be described.

Figure 20:
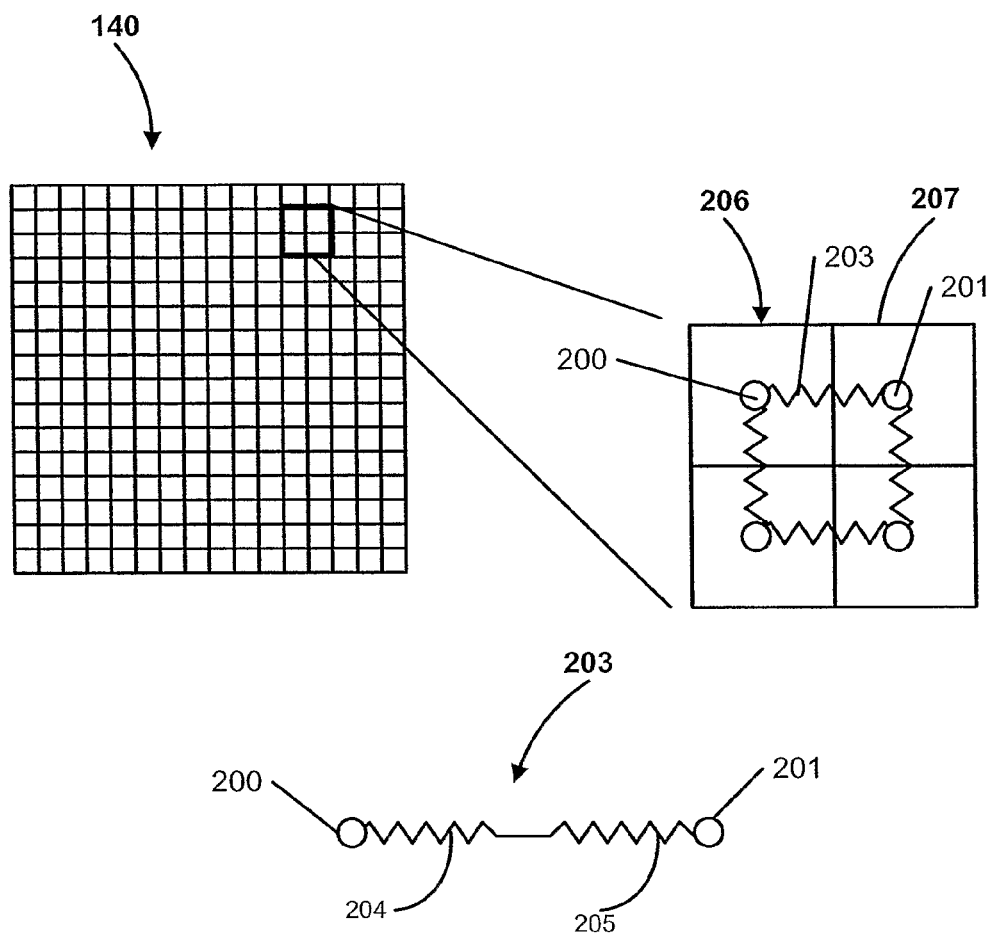
FIG. 20 illustrates schematically the manner in which the constraining effects of adjacent cells are modelled.

FIG. 20 illustrates schematically the manner in which the constraining effects of adjacent cells are modeled. Each of the cells making up array 140 in a complete panel is represented by a node 200 at its centre and, for modelling interaction with an adjacent cell having a respective node 201, a spring 203 connects the nodes. The spring may be in tension or compression to represent forces due to expansion and contraction of cell size.

Each spring 203 is considered as two component springs connected in series so that, as shown in FIG. 20, a spring 203 is comprised of a first portion 204 connected to a first node 200 and a second portion 205 connected to a second node 201. The first and second portions 204, 205 have the mechanical properties of the materials of the cells to which the nodes 200 and 201 correspond.

In an initial state of the model, the relaxed (zero tension) length of each of the portions 204, 205 is defined as being equal to one half of the width of the respective cell 206, 207. Since changes in relative positions of cells are to be modeled, the arbitrary assumption of zero tension in the initial model stage is acceptable. The force exerted by the spring 203 is assumed to be related to relative movement of the nodes 200 and 201 by a Hooke's constant K which is, for a given pair of cells, a function of the modulus of elasticity of each of the cells. To model a process involving temperature change ?T, the unconstrained length of the spring 203 is calculated a function of the modulus of the elasticity E and the coefficient of thermal expansion of the materials forming the respective cells as determined using equation 1.

To use the spring and node model of FIG. 20, each cell is notionally constrained back to its original size, thereby storing potential energy which is modeled as being acquired as tension or compression in the spring associated with each pair of adjacent cells.

The potential energy of each spring combination is calculated using equation 2.

$$U = 0.5 \cdot K \cdot 1^2 \qquad \text{Equation 2}$$

where
  U=potential energy;
  K=Hooke's constant; and
  l=extension of spring

For example, if cells 206 and 207 in FIG. 20 have expanded by distances $l_1$ and $l_2$ respectively, this corresponds in the spring representation to an extension of the spring 203 by $\frac{1}{2} \cdot (l_1 + l_2)$ which is taken to be the value of l in equation 2. The model now allows the position of each node to move to an equilibrium position.

As shown in FIG. 21, the finite element model represents the cells 141 of array 140 as a grid 210 of connected nodes 211, with adjacent nodes connected by springs 203 for each of which potential energy values U are modeled. In one embodiment, cell sizes E are compared with the initial cell size A and the change of dimension of the cells used as an input to the finite element model, the resulting output being new positions of nodes in grid 210. Since however the various process stages referred to above have phases in which materials exhibit different mechanical and thermal properties and since cell compositions in some cases are different for different phases, a refined model constitutes a further embodiment in which the finite element model is used to separately represent a number of stages of the overall process, using appropriate values of physical parameters for each stage. For example, the finite element model may be used to generate data representing the position of nodes 211 in grid 210 for each stage corresponding to cell sizes B, C, D and E respectively.

In the following description a single application of the finite element model will be described, it being understood that the model could be sequentially applied in a number of stages.

The model is initialized with data corresponding to cell size A with the nodes 211 in regular array as shown in FIG. 21 in which rows of nodes extend in the X direction and columns extend in the Y direction in square formation.

After a physical process has been modeled to derive new cell sizes, differences in the potential energies stored in each spring will result in movement of the nodes to an equilibrium position which is no longer a regular array. The positions of the nodes will have moved as shown for example for a sub set of nodes in FIG. 22 where it can be readily seen that the new positions of nodes provides a non-linear model of distortion.

The change of size information for each cell is used to calculate the potential energy U in each of the four springs connected to the node representing the cell. The potential energy U is assumed to be equal work done in extending the spring by a force calculated using Hookes law multiplied by the distance $l = \frac{1}{2}(l_1 + l^2)$. For cells consisting of multiple layers bonded together, a combined Hookes constant is calculated from equation 3, given below.

$$K = \frac{W}{L} \sum_{i=1 \, to \, n} E_i \cdot t_i \qquad \text{Equation 3}$$

Where:
K=Hookes constant
$E_i$=Modulus of Elasticity for layer i material
  $t_i$=Thickness of layer i material
  L=Length of cell in direction of spring
  W=Width of cell orthogonal to spring For spring components 204, 204, values of Hookes constant $K_1$ and $K_2$ are now known and the contoured value of Hookes constant for the spring 203 obtained from Equation 4;

$$K = \frac{K_1 \cdot K_2}{K_1 + K_2} \quad \text{Equation 4}$$

Combined Hookes Constant:

To determine the movement of each node, an iterative process is adopted. As a first step, a single node 212 as shown in FIG. 21 is modeled as being free to move under the action of the four springs which connected to nearest neighbors, i.e. nodes 213-216, making the assumption that the nearest neighbors are fixed, i.e. the cell 212 is the only node allowed to move. The equilibrium position of node 212 is calculated, for example by determining the position of the node at which the values of energy for each of the springs are equal. The new position of node 212 is recorded and the process repeated for each one of the nodes of the grid 210 until new positions have been calculated for each node. For some nodes, constraints on movement may need to be applied, as for example where restraining pins or welds or other fixing mechanisms are known to apply to the cell.

The amount of movement of the nodes is compared with a convergence threshold and, if the movement of any one of the cells exceeds the convergence threshold, a further iteration takes place in which each cell is allowed to move to a new equilibrium, based on the previously calculated positions of all of the surrounding nodes.

Again cell movement is compared with the convergence threshold and so on. Ultimately, convergence is achieved in which the movement of cells is determined to less than the convergence threshold and no further iterations are then required.

Figure 22:
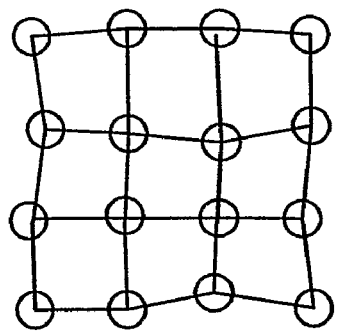
FIG. 22 shows the nodes in a convergence state.

For those embodiments in which further applications of the finite element model are applied in order to model cell movement in separate processing stages, the output data of the initial stage is used as input for determining the initial positions of nodes at the start of the next modelling process. The new modelling process will utilize different values of physical constants retrieved from stored model data in the materials library database 93. FIG. 22 shows an example of a convergence state.

The end result of this process comprises data indicating the movement of nodes to new positions which in effect define the compensated positions of cells to be incorporated in compensated layout data. The compensated layout data could be derived simply by applying a vector map of the modeled data to each pixel of the layout data. In a preferred embodiment however, a subset of cells (i.e. pixels) are aggregated into a low resolution grid, the grid for example comprising ten by ten blocks of cells, and data representing the displacement of each of the blocks is input to layout compensation module 96.

The steps of calculating cell size and modelling the movement of cell positions may be repeated for any number of corresponding laminating phases in the manufacturing process, working backwards from the desired final layout applied to the finished laminated state of the product, including the example of sequentially laminated product where multiple stacks of inner layers are themselves laminated to produce the final product.

Figure 23:
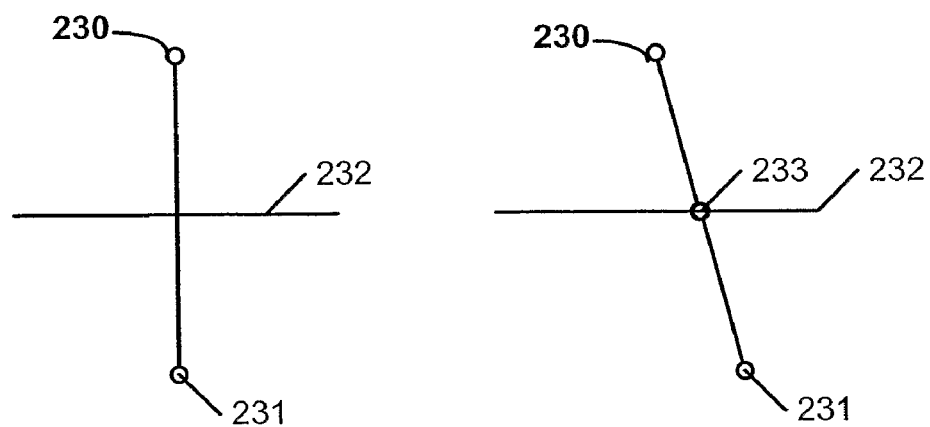
FIG. 23 illustrates a modification to original layout to include cell position compensation.

Data representing the original layout may be modified in a number of ways. In one example represented schematically in FIG. 23, data defining a straight line in the layout is specified in terms of two points 230,231 representing the end points of the line. If the line crosses a boundary 232 between the aggregated cell blocks referred to above, the line is modified to take account of movement between the blocks by generating additional node 233 to effect a deviation of the line.

Figure 24:
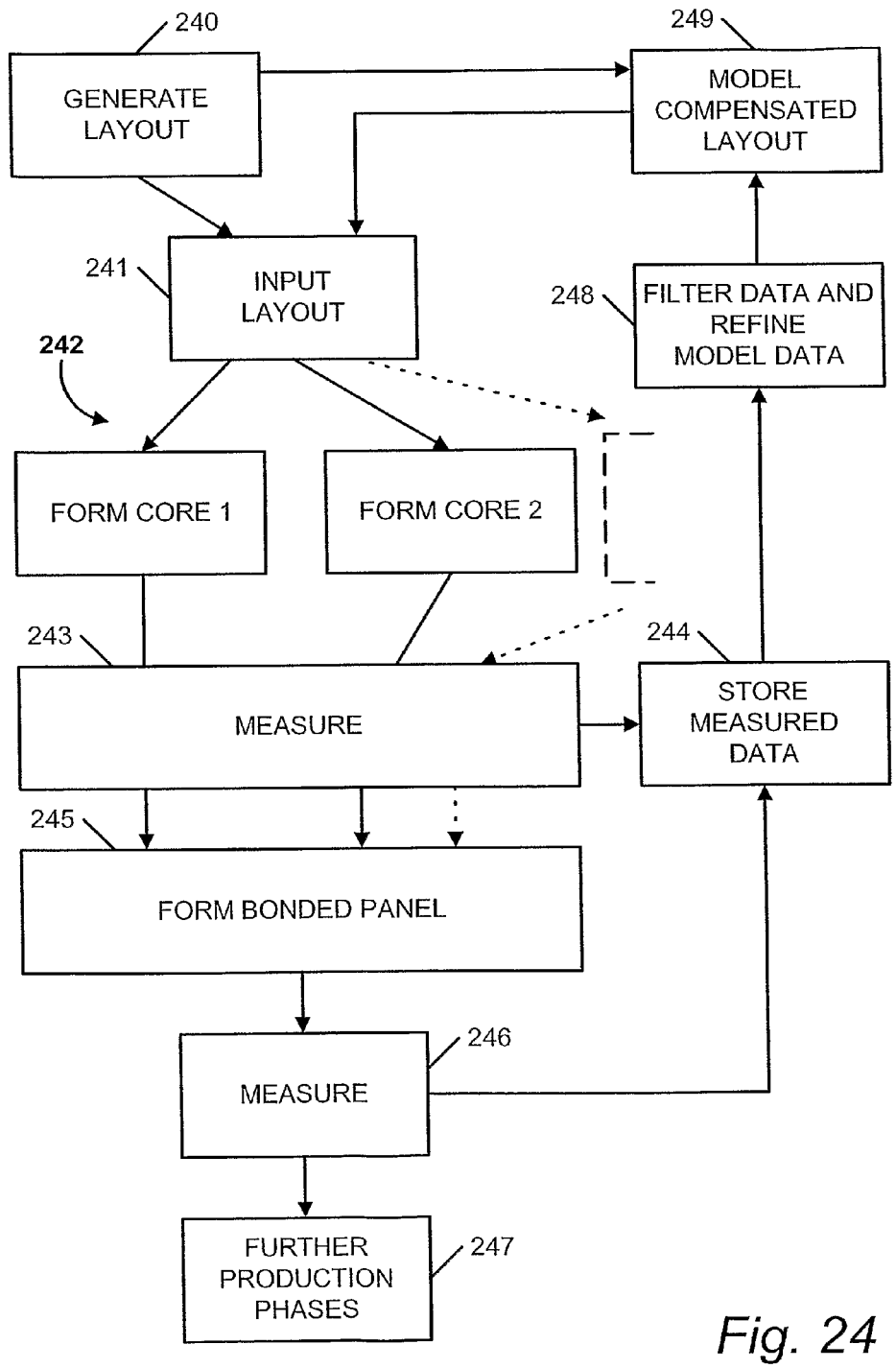
FIG. 24 is a flowchart illustrating measurements at multiple production stages used for refining model data.

FIG. 24 illustrates the manner in which measurements during the production of the pcb may be taken at more than one stage and used for refining model data. At step 240 the initial layout data is generated and compensated layout data is modeled at step 249. At step 241, compensated layout data is input to computer aided manufacturing apparatus where it is processed into instructions for forming the correct patterns on the layers of cores. A number of cores are then generated at step 242, the number typically being in the range of 1 to 5, and at step 243 measurements are made of fiduciary points in the finished cores and are output to be stored in step 244.

At step 245 the resulting cores are composited in a stack which undergoes heat and pressure treatment to form a bonded panel. The resulting panel is measured at step 246 to measure fiduciary points on the cores internally laminated within the stack and the measurements are again stored as measured data corresponding to step 244. Further production stages follow at step 247.

In this way, stored measured data is available to refine the model data at step 248 and compensated layout data may be modeled at step 249. This compensated layout data may be again input to step 241 for further production using compensated layout information.

Figure 25:
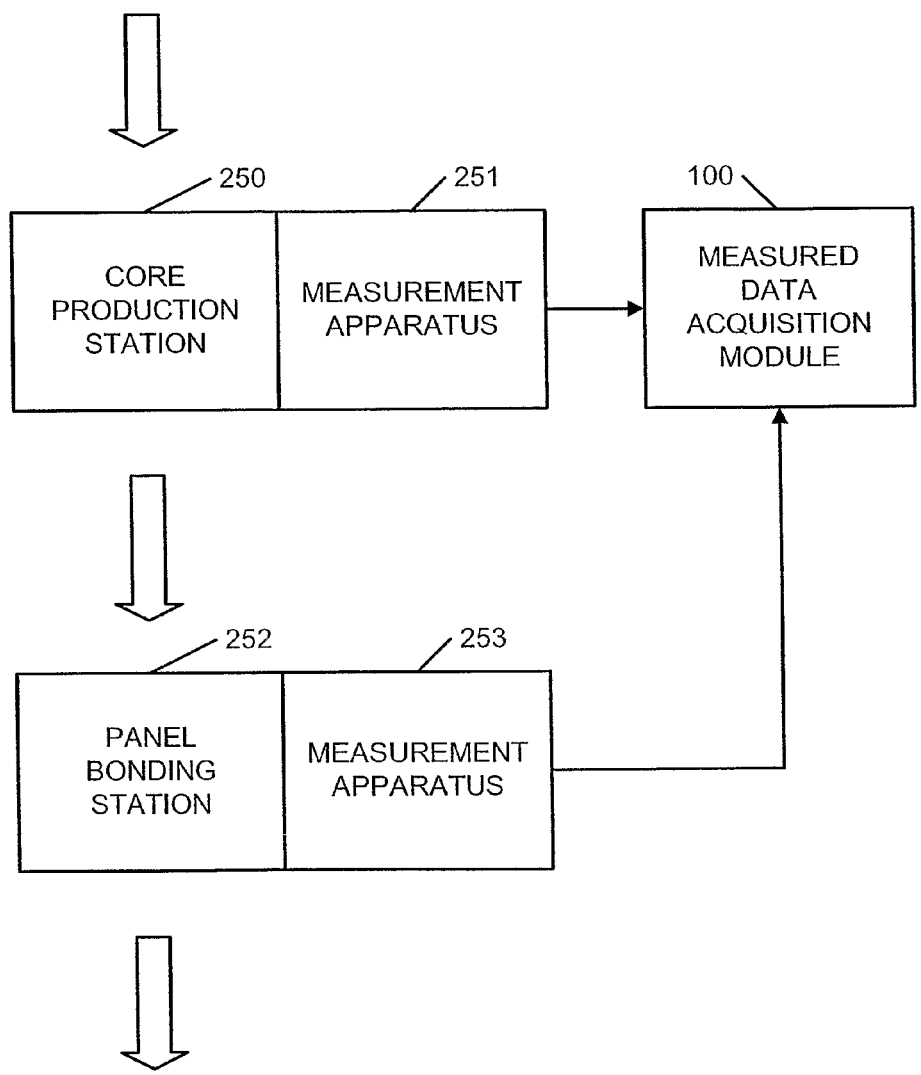
FIG. 25 illustrates schematically apparatus for obtaining two separate sets of measurement data.

FIG. 25 illustrates schematically apparatus for obtaining two separate sets of measurement data, core production station 250 having respective measurement apparatus 251 and the panel bonding station 252 having respective measurement apparatus 253. Measured data acquisition module 100 receives the measurements for each of these measurement apparatus for storage in memory.

The ability to obtain measurements and feedback on modelling data at more than one stage during production is a significant improvement over prior art systems where at best data is measured in the pcb at the bonded panel stage for comparison with the desired layout in order to calculate compensating amounts to be applied to the initial layout for further production runs. The arrangement of FIGS. 24 and 25, in conjunction with any of the models described in previous embodiments, provides non-linear compensation in a more controlled manner. If for example the majority of deviations in layout occur during the core production station rather than the panel bonding station, the model can be adjusted to simulate the core production process by storing appropriate model data in a way which generates greater compensation for this phase of the model. There would for example be a situation in which the model data used to generate cell size B in FIG. 16 was markedly different from the model data used to generate cell size C in FIG. 16, thereby improving the likelihood that the overall accuracy of the model was improved.

Figure 26:
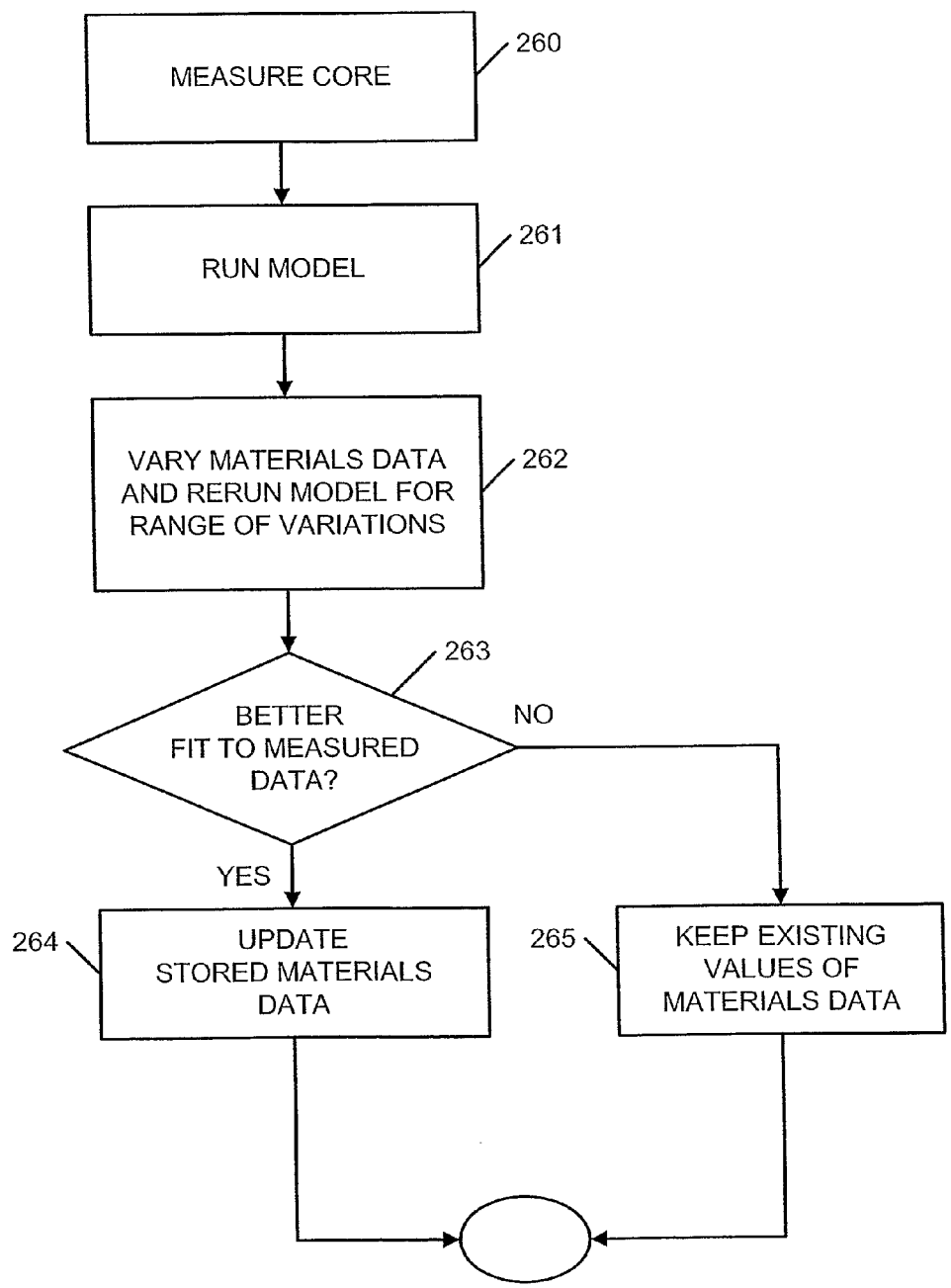
FIG. 26 is a flowchart illustrating the way in which stored material data may be updated from measured data.

FIG. 26 illustrates schematically the way in which stored materials data may be updated from measured data. At step 260, the core measurements are made and at step 261 a model of the core forming process is run using the currently stored materials data.

At step 262 further runs of the model are carried out for incrementally varied values of the materials data and the end results compared at step 263 with those obtained from the running of the model at step 261 to see if a closer fit to the measured data has been obtained. If at step 263 it is determined that a better fit can be obtained, the materials data providing the best fit is stored in place of the existing materials data at step 264, the existing materials data otherwise being retained at step 265.

The various control processes and data processing processes described above in accordance with the disclosed embodiments may typically be implemented using the computer 80 of FIG. 8 under the control of computer programs stored in storage medium 81. Aspects of the present invention thus provides a storage medium storing processor implementable instructions for controlling a processor to carry out the methods as hereinbefore described.

Further the computer program can be obtained in electronic form for example by downloading the code of a network such as the Internet. Thus in accordance with another aspect of the present invention there is provided an electrical signal carrying processor implementable instructions for controlling a processor to carry out the methods as hereinbefore described.

The invention claimed is:

1. A method of operating a control system for manufacturing control of printed circuit boards, the steps performed by the control system comprising:
   modelling a production process in which a composite layer is formed from constituent layers, wherein the modelling comprising generating non-linear compensation data to compensate for non-linear distortion occurring in a circuit layout applied to at least one of the constituent layers and using stored values of parameters representing properties of respective materials of the constituent layers;
   outputting the non-linear compensation data for modifying a desired layout to generate a compensated layout to be applied in the production process;
   receiving measurement data representative of an actual circuit layout output from at least one phase of the production process utilizing the compensated layout;
   processing the measurement data to obtain optimized values of the parameters used in modelling; and
   updating the stored values of parameters with optimized values of the parameters used in modelling to be used in future modelling of the production process.

2. A method as claimed in claim 1 wherein the production process comprises a succession of phases, each of which introduces respective distortion, and wherein the method comprises:
   modelling each phase with reference to respective stored values of parameters;
   receiving and processing measurement data from each phase of the production process; and
   updating the respective stored values with respective optimized values.

3. A method as claimed in claim 2 wherein a first production phase comprises forming at least one inner layer from a plurality of constituent layers and a second phase comprises forming the composite layer from a stack of layers comprising the at least one inner layer.

4. A method as claimed in claim 1 wherein the modelling uses an algorithm to predict movement of fiduciary points included in the circuit layout, the algorithm comprising polynomial equations for calculating movement in warp and weft directions and having empirically derived coefficients.

5. A method as claimed in claim 1 wherein the modelling is based on theoretical analysis of behavior of the respective materials of the constituent layers using finite element analysis.

6. A method as claimed in claim 5 wherein the modelling takes as a starting point the composite layer having the desired layout free of distortion and divided into a grid of cells, each cell comprising layers having properties of the respective materials of the constituent layers, and modeling a change of size of each cell in a succession of preceding phases to arrive at a cell size beginning at the production process; using finite element modelling to determine by convergence an equilibrium position of the cells at the beginning of the production process, and deriving compensating data for defining the compensated layout from the equilibrium positions.

7. A method as claimed in claim 5 wherein an inner layer production phase forming an inner layer comprises laminating at least one conductor layer onto a substrate layer at an elevated lamination temperature and, after cooling to a normal temperature lower than the elevated lamination temperature, etching the conductive layer to form a pattern corresponding to the circuit layout, and wherein stress relief occurring after etching is modeled assuming an etched pattern was applied by removing material from the conductive layer at the elevated lamination temperature and the non-linear distortion as having occurred during cooling to normal temperature in accordance with the theoretical analysis of behaviour of materials of the constituent layers.

8. A method as claimed in claim 1 further comprising filtering the measurement data and processing filtered measurement data to obtain optimized values of the parameters used in the modelling.

9. A method of manufacturing a printed circuit board comprising operating a control system in accordance with a method as claimed in claim 1, the method comprising:
   forming the composite layer to constitute the printed circuit board from the constituent layers using the compensation data output from the control system;
   taking measurements of the actual circuit layout output from at least one phase of the production process to obtain the measurement data; and
   inputting the measurement data to the control system.

10. A control system for manufacturing control of printed circuit boards, the control system comprising:
   a processor;
   a memory coupled to the processor;
      a modelling module executed by the processor under the control of computer program code stored in the memory, the modeling module adapted to model a production process in which a composite layer is formed from constituent layers, the modelling module generating non-linear compensation data to compensate for non-linear distortion occurring in a circuit layout applied to at least one of the constituent layers and the model using stored values of parameters representing properties of respective materials of the constituent layers;
      the modelling module being adapted to output the non-linear compensation data for modifying a desired layout to generate a compensated layout to be applied in the production process, the control system further comprising an interface adapted to receive measurement data representative of an actual circuit layout output from at least one phase of the production process utilizing the compensated layout;

a model data optimizing module coupled to the processor and the memory, the model data optimizing module adapted to process the measurement data to obtain optimized values of the parameters used in modelling and update the stored values of parameters with optimized values of the parameters used in modelling to be used in future modelling of the production process.

11. A control system as claimed in claim 10 wherein the production process comprises a succession of phases, each of which introduces respective distortion, and wherein the modelling module is adapted to model each phase with reference to respective stored values of parameters; the model data optimizing module being adapted to receive and process measurement data from each phase of the production process, and to update the respective stored values with respective optimized values.

12. A control system as claimed in claim 10 wherein the modelling module comprises an algorithm adapted to predict movement of fiduciary points included in the circuit layout, the algorithm comprising polynomial equations for calculating movement in warp and weft directions and having empirically derived coefficients.

13. A control system as claimed in claim 10 wherein the modelling module embodies a based on theoretical analysis of behavior of the respective materials of the constituent layers using finite element analysis.

14. A control system as claimed in claim 13 wherein the modelling takes as a starting point the composite layer having the desired layout free of distortion and divided into a grid of cells, each cell comprising layers having properties of the respective materials of the constituent layers, the modelling module being adapted to model a change of size of each cell in a succession of preceding phases to arrive at a cell size beginning at the production process, to use finite element modelling to determine by convergence an equilibrium position of the cells at the beginning of the production process; and to derive the compensating data for
  defining the compensated layout from the equilibrium positions.

15. A control system as claimed in claim 13 wherein an inner layer production phase forming an inner layer comprises laminating at least one conductor layer onto a substrate layer at an elevated lamination temperature and, after cooling to a normal temperature lower than the elevated lamination temperature, etching the conductive layer to form a pattern corresponding to the circuit layout, and wherein the modelling module is adapted to model stress relief occurring after etching by assuming an etched pattern was applied by removing material from the conductive layer at the elevated lamination temperature and the non-linear distortion as having occurred during cooling to normal temperature in accordance with theoretical analysis of behaviour of materials of the constituent layers.

16. A control system as claimed in claim 10 further comprising a filter module adapted to filter the measurement data and wherein the system is adapted to process the filtered measurement data to obtain optimized values of the parameters used in modelling.

17. A control system as claimed in claim 10 further comprising:
  a manufacturing apparatus for forming the composite layer from the constituent layers using the non-linear compensation data output from the control system;
  a measurement apparatus for taking measurements of the actual circuit layout output from at least one phase of the production process to obtain the measurement data; and
  a means for inputting the measurement data to the control system.

18. A method of operating a control system for manufacturing control of printed circuit boards, the steps performed by the control system comprising:
  modelling a production process in which a composite layer is formed from constituent layers, wherein the modelling comprising generating compensation data to compensate for distortion occurring in a circuit layout applied to at least one of the constituent layers; and
  outputting the compensation data for modifying a desired layout to generate a compensated layout to be applied in the production process, wherein the modelling step comprises:
  representing the desired layout of an end result of the production process as an array of cells of nominal size;
  determining modified cell sizes corresponding to an initial stage of the production process, ignoring interaction between cells, taking account of changes in properties of materials associated with each cell during the production process, representing cell positions at an end of the production process as a regular array of the cells having nominal size;
  applying a finite element model to take account of interaction between cells and thereby to determine modified positions of each cell at the initial stage of the production process; and
  generating the compensation data from the modified cell positions .

19. A method as claimed in claim 18 wherein the production process comprises a plurality of production phases each of which introduces respective distortions and wherein the modelling step comprises:
  modelling each production phase to determine cell sizes and cell positions corresponding to a state of the constituent layers of a start of the production phase.

20. A method as claimed in claim 19, wherein, for each consecutive pair of production phases of the production process, the modelling of a first occurring production phase of a pair utilizes the cell size and the cell position data calculated by the modelling of a second occurring production phase.

21. A method as claimed in claim 18 wherein the modelling uses stored values of parameters representing properties of respective materials of the constituent layers, the method further comprising:
  receiving measurement data representative of an actual circuit layout from at least one production phase of the production process utilizing the compensated layout;
  processing the measurement data to obtain optimized values of the parameters used in modelling; and
  updating the stored values of parameters with optimized values of the parameters used in modelling to be used in future modelling of the production process.

22. A method as claimed in claim 21 wherein the production process comprises a succession of production phases, each of which introduces respective distortion, and wherein the method comprises:
  modelling each production phase with reference to the respective stored values of parameters; and
  receiving and processing measurement data from each production phase of the production process, and updating the respective stored values of parameters with respective optimized values.

23. A method as claimed claim 21 further comprising filtering the measurement data and processing the filtered measurement data to obtain optimized values of the parameters used in the modelling.

24. A method as claimed claim 18 wherein the finite element model represents cell positions as nodes with springs connecting adjacent nodes, an initial potential energy in each spring being calculated according to the initial potential energy required to constrain adjacent cells from their modified cell sizes to their nominal size; and the modified positions of each cell being determined by calculating an equilibrium cell position in which potential energy in the springs substantially converges to a common value.

25. A method as claimed claim 18 wherein an inner layer production phase forming the inner layer comprises laminating at least one conductor layer onto a substrate layer at an elevated lamination temperature and, after cooling to a normal temperature lower than the elevated lamination temperature, etching the conductive layer to form a pattern corresponding to a circuit layout, and wherein stress relief occurring after etching is modeled assuming an etched pattern was applied by removing material from the conductive layer at the elevated lamination temperature and modelling the distortion as having occurred during cooling to normal temperature in accordance with theoretical analysis of behaviour of materials of the constituent layers.

26. A method of manufacturing a printed circuit board comprising operating a control system in accordance with a method as claimed claim 18, the method comprising forming the composite layer constituting the printed circuit board from constituent layers using a compensated layout determined using the compensation data output from the control system.

27. A control system for manufacturing control of printed circuit boards, the control system comprising:
 a processor;
 a memory coupled to the processor;
  a modelling module executed by the processor under the control of computer program code stored in the memory, the modeling module adapted to model a production process in which a composite layer is formed from constituent layers, the modelling module generating compensation data to compensate for distortion occurring in a circuit layout applied to at least one of the constituent layers; and
  the modelling module being adapted to output the compensation data for modifying a desired layout to generate a compensated layout to be applied in the production process;
 wherein the modelling module is adapted to:
 represent the desired layout of an end result of the production process as an array of cells of nominal size;
 to determine modified cell sizes corresponding to an initial stage of the production process, ignoring interaction between cells, taking account of changes in properties of materials associated with each cell during the production process;
 to represent cell positions at the end of the production process as a regular array of the cells having nominal size;
 to apply a finite element model to take account of interaction between cells and thereby to determine modified positions of each cell at the initial stage of the production process; and
 to generate the compensation data from the modified cell positions.

28. A control system as claimed in claim 27 wherein the production process comprises a plurality of production phases each of which introduces respective distortions and wherein the modelling module is adapted to model each production phase to determine cell sizes and cell positions corresponding to a state of the constituent layers of a start of the production phase.

29. A control system as claimed in claim 28, wherein, for each consecutive pair of production phases of the production process, the modelling module is adapted to model a first occurring production phase of a pair utilizing the cell size and the cell position data calculated by the modelling of a second occurring production phase.

30. A control system as claimed in claim 28 wherein the production phase forming an inner layer comprises laminating at least one conductor layer onto a substrate layer at an elevated lamination temperature and, after cooling to a normal temperature lower than the elevated lamination temperature, etching the conductive layer to form a pattern corresponding to the circuit layout, and wherein the modelling module is adapted to model stress relief occurring after etching by assuming an etched pattern was applied by removing material from the conductive layer at the elevated lamination temperature and modelling the distortion as having occurred during cooling to normal temperature in accordance with theoretical analysis of behaviour of materials of the constituent layers.

31. A control system as claimed in claim 27 wherein the modelling module is adapted to use stored values of parameters representing properties of respective materials of the constituent layers, the system further comprising:
 an interface for receiving measurement data representative of an actual circuit layout from at least one phase of the production process utilizing the compensated layout;
 and a model data optimizing module adapted to process the measurement data to obtain optimized values of the parameters used in modelling and to update the stored values of parameters with optimized values of the parameters used in modelling to be used in future modelling of the production process.

32. A control system as claimed in claim 31 wherein the production process comprises a succession of production phases, each of which introduces respective distortion, and wherein the system is adapted to model each production phase with reference to the respective stored values of parameters to receive and process the measurement data from each production phase of the production process, and to update the stored values with respective optimized values.

33. A control system as claimed in claim 31 further comprising a filter module adapted to filter the measurement data and wherein the model data optimizing module is adapted to process the filtered measurement data to obtain optimized values of the parameters used in modelling.

34. A control system as claimed in claim 31 further comprising measurement apparatus for taking measurements of actual circuit layout from at least one phase of the production process and means for inputting the measurement data to the control system.

35. A control system as claimed in claims 27 wherein the finite element model represents cell positions as nodes with springs connecting adjacent nodes, an initial potential energy in each spring being calculated according to the energies required to constrain adjacent cells from their modified cell sizes to their nominal size; and the modified positions of each cell being determined by calculating an equilibrium cell position in which a potential energy in springs substantially converges to a common value.

36. A control system as claimed in claim 27, further comprising manufacturing apparatus for forming the composite layer from constituent layers using the compensation data output from the control system.

37. A non-transitory computer readable storage medium having instructions stored thereon that, when executed by a processor, cause the processor to perform a method for controlling a control system comprising:
- modelling a production process in which a composite layer is formed from constituent layers, wherein the modelling comprising generating non-linear compensation data to compensate for non-linear distortion occurring in a circuit layout applied to at least one of the constituent layers and using stored values of parameters representing properties of respective materials of the constituent layers;
- outputting the non-linear compensation data for modifying a desired layout to generate a compensated layout to be applied in the production process;
- receiving measurement data representative of an actual circuit layout output from at least one phase of the production process utilizing the compensated layout;
- processing the measurement data to obtain optimized values of the parameters used in modelling; and
- updating the stored values of parameters with optimized values of the parameters used in modelling to be used in future modelling of the production process.

38. The non-transitory computer readable storage medium of claim 37 wherein the production process comprises a succession of phases, each of which introduces respective distortion, and wherein the method comprises:
- modelling each phase with reference to respective stored values of parameters;
- receiving and processing measurement data from each phase of the production process; and
- updating the respective stored values with respective optimized values.

* * * * *